(12) United States Patent
Chun

(10) Patent No.: US 9,817,924 B2
(45) Date of Patent: Nov. 14, 2017

(54) SWEEPING A PROFILE ALONG SMALL CIRCULAR ARCS OF A PATH

(71) Applicant: Autodesk, Inc., San Rafael, CA (US)

(72) Inventor: Glenn Changhyuck Chun, West Linn, OR (US)

(73) Assignee: Autodesk, Inc., San Rafael, CA (US)

( * ) Notice: Subject to any disclaimer, the term of this patent is extended or adjusted under 35 U.S.C. 154(b) by 398 days.

(21) Appl. No.: 14/681,946

(22) Filed: Apr. 8, 2015

(65) Prior Publication Data

US 2015/0294035 A1 Oct. 15, 2015

Related U.S. Application Data

(60) Provisional application No. 61/977,733, filed on Apr. 10, 2014.

(51) Int. Cl.
| G06G 7/48 | (2006.01) |
| G06F 17/50 | (2006.01) |
| G06T 17/10 | (2006.01) |
| G06K 7/10 | (2006.01) |

(52) U.S. Cl.
CPC ......... *G06F 17/50* (2013.01); *G06K 7/10544* (2013.01); *G06T 17/10* (2013.01)

(58) Field of Classification Search
CPC ......... G06T 17/10; G06T 17/50; G06F 17/50; G06K 7/10544; B64C 23/065
See application file for complete search history.

(56) References Cited

U.S. PATENT DOCUMENTS

| 8,836,701 B1* | 9/2014 | Rockwood | G06F 17/50 345/419 |
| 2002/0113785 A1* | 8/2002 | Hill | G06T 17/10 345/420 |
| 2003/0006285 A1* | 1/2003 | Hecht | G06K 7/10544 235/454 |
| 2008/0040080 A1* | 2/2008 | Bae | G06F 17/50 703/1 |
| 2008/0100615 A1* | 5/2008 | Zhao | G06T 17/10 345/420 |
| 2010/0121626 A1* | 5/2010 | Montana | G06T 17/10 703/6 |
| 2012/0049010 A1* | 3/2012 | Speer | B64C 23/065 244/45 R |

* cited by examiner

*Primary Examiner* — Kandasamy Thangavelu
(74) *Attorney, Agent, or Firm* — Gates & Cooper LLP

(57) ABSTRACT

A method, apparatus, article of manufacture, and computer program product provide the ability to sweep a profile along a circular arc of a path. A sweep operation to sweep a profile along an arc of a path is initialized in a CAD application. For each path segment (in the path) that is circular, a determination is made regarding whether the profile crosses an axis of revolution of the circular path segment at a start position of the circular path segment. The profile that crosses the axis of revolution of the circular path segment is trimmed. The trimmed profile and an association with the circular path segment having the axis of revolution that is crossed by the trimmed profile are stored. A selective union operation that joins the solid bodies from the trimmed profiles is performed.

14 Claims, 32 Drawing Sheets

SWEEPING A PROFILE ALONG SMALL CIRCULAR ARCS OF A PATH

CROSS-REFERENCE TO RELATED APPLICATIONS

This application claims the benefit under 35 U.S.C. Section 119(e) of the following co-pending and commonly-assigned U.S. provisional patent application(s), which is/are incorporated by reference herein:

Provisional Application Ser. No. 61/977,733, filed on Apr. 10, 2014, by Glenn Changhyuck Chun, entitled "Sweeping a Profile Along Small Circular Arcs of a Path".

BACKGROUND OF THE INVENTION

1. Field of the Invention

The present invention relates generally to computer-aided design software, and in particular, to a method, system, apparatus, computer program product, and article of manufacture for sweeping a profile along small circular arcs.

2. Description of the Related Art

Computer-aided design (CAD) users often use a sweep operation to cut model edges with any profile that they want. However, all modeling programs in the design software industry disallow a large profile to be swept around small circular arcs of a path. As the profile is swept around the axis of an arc with a radius smaller than the profile size, the profile crosses the axis. This situation causes self-intersecting geometry around the circular path segment, so the sweep operation fails. In reality, it is possible to physically create the shape with machining tools, such as a half round mill or cutter. In other words, in reality, it may be easier to create geometry by manufacturing/milling than it is to model the same geometry. Since more and more manufacturing is driven from solid modeling output, the ability to easily create manufacturable output is a factor in improved customer satisfaction and competitive differentiation. Accordingly, it is desirable to enable design software to be able to sweep a profile (e.g., a large profile) along small circular arcs of a path to create a valid sweep result.

FIGS. 1-5 illustrate the prior art problems associated with creating illegal geometry. FIG. 1 illustrates an object 100 to be swept using a profile 102 along path 104. FIG. 2 illustrates the outline 202 of the resulting shape after sweeping profile 102 along path 104. FIG. 3 illustrates the position of the profile 102A prior to sweeping the profile 102 along the circular arc 104A of path 104. FIG. 4 illustrates the rotation 402 around the axis of rotation 404 of the profile 102 as the sweep operation proceeds around the circular arc of path 104. Once the sweep around arc 104A is completed, the outline of the shape along circular path 104A is illustrated at 406. FIG. 5 illustrates different angles of the resulting illegal geometry 406 that are not allowed. As a consequence of the resulting illegal geometry, when produced, prior art systems often exit and/or produce errors such that the sweep operation cannot be conducted or is resolved unacceptably.

In view of the above, what is needed is the capability to methodically and correctly conduct a valid sweep operation of a profile along a circular arc of a path (that results in a valid object).

SUMMARY OF THE INVENTION

Embodiments of the invention conduct a sweep operation of a profile along a small circular arc of a path while generating a valid result that does not contain any self-intersecting geometry. Such a result mimics the kind of cut that a milling machine would create when traversing corners. Accordingly, embodiments of the invention break the conventional design software requirement requiring the minimum radius of a path to be larger than the maximum radius of the profile.

BRIEF DESCRIPTION OF THE DRAWINGS

Referring now to the drawings in which like reference numbers represent corresponding parts throughout.

DETAILED DESCRIPTION OF THE PREFERRED EMBODIMENTS

In the following description, reference is made to the accompanying drawings which form a part hereof, and which is shown, by way of illustration, several embodiments of the present invention. It is understood that other embodiments may be utilized and structural changes may be made without departing from the scope of the present invention.

Hardware Environment

Figure 1:
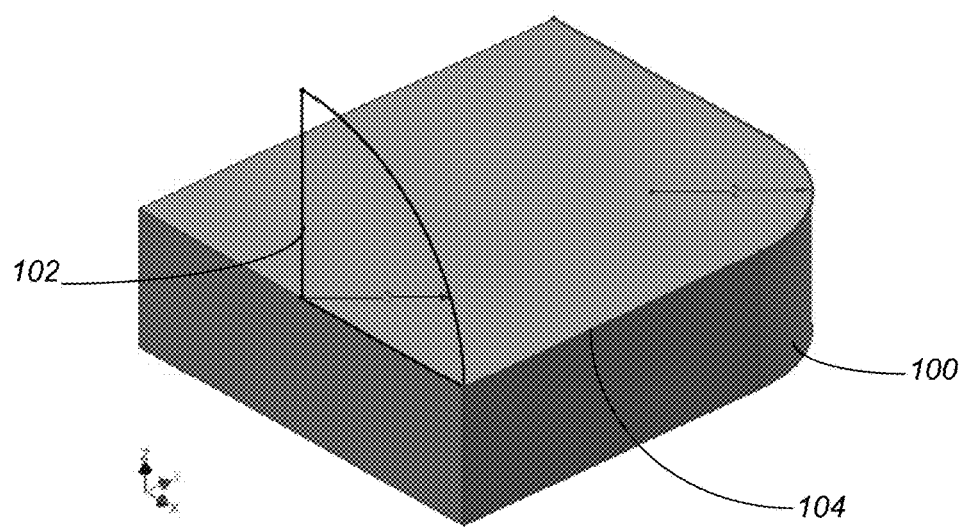
FIG. 1 illustrates an object to be swept using a profile along a path.
Figure 2:
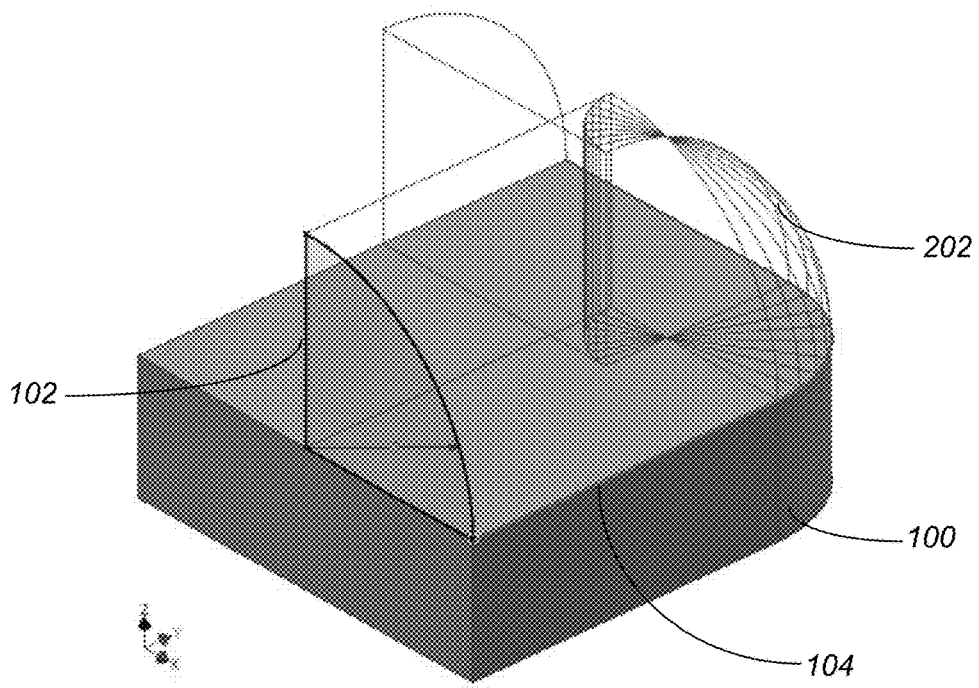
FIG. 2 illustrates the outline of a resulting shape after sweeping a profile along a path.
Figure 3:
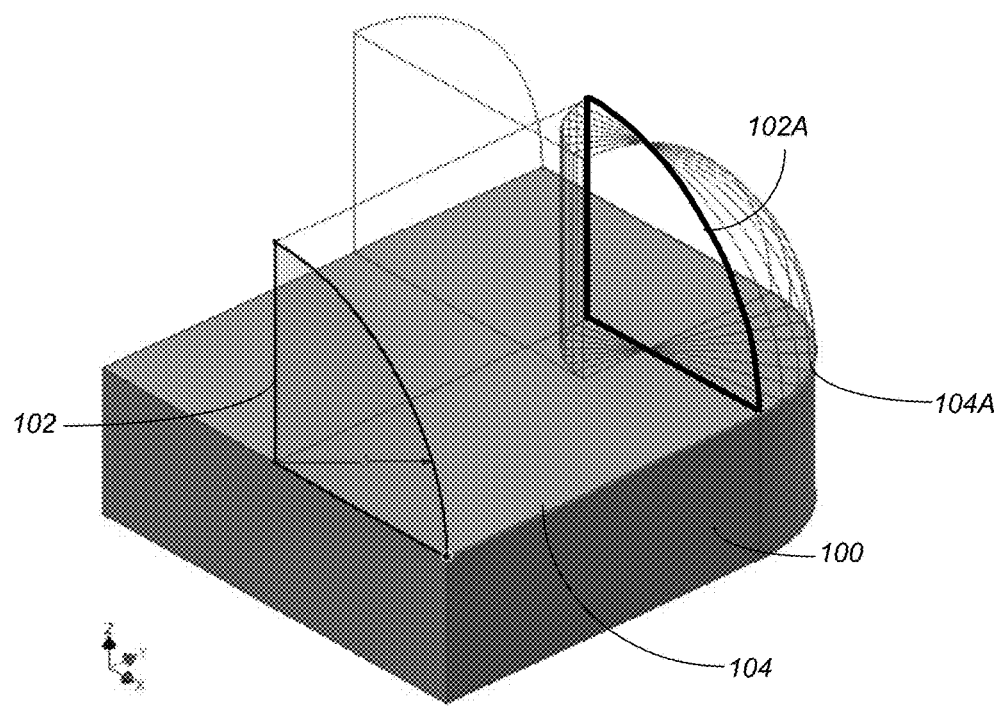
FIG. 3 illustrates the position of a profile prior to sweeping the profile along a circular arc of a path.
Figure 4:
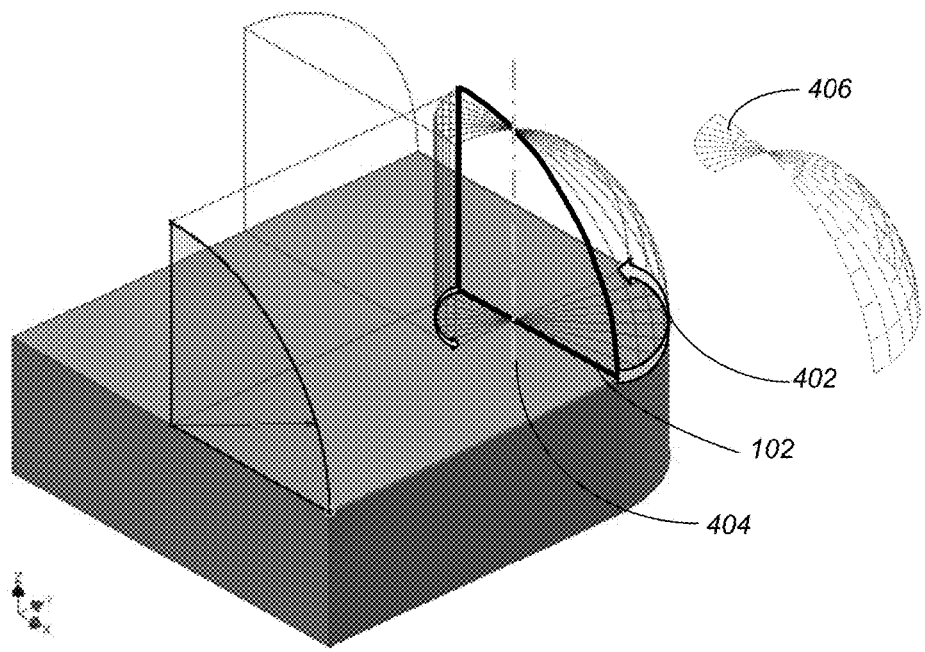
FIG. 4 illustrates the rotation around the axis of rotation of a profile as a sweep operation proceeds around a circular arc of a path.
Figure 5:
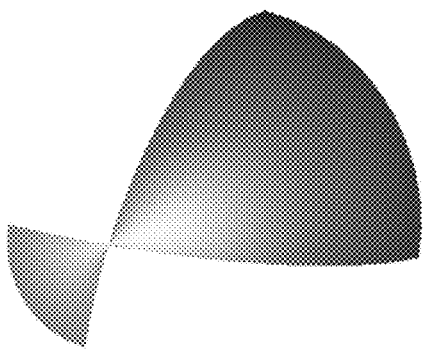
FIG. 5 illustrates different angles of illegal geometry resulting from a sweep operation in the prior art.
Figure 5:
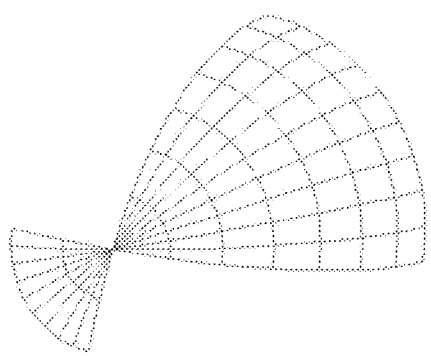
Figure 5:
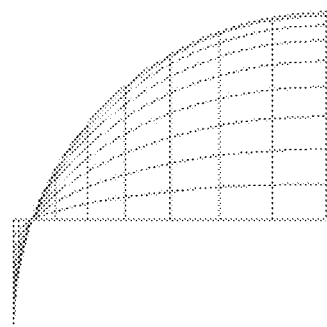
Figure 5:
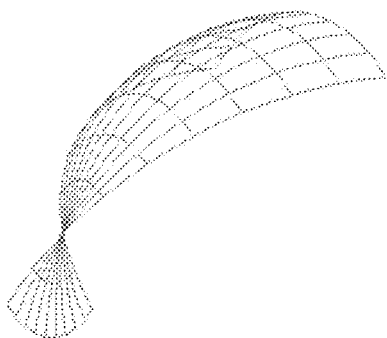
Figure 6:
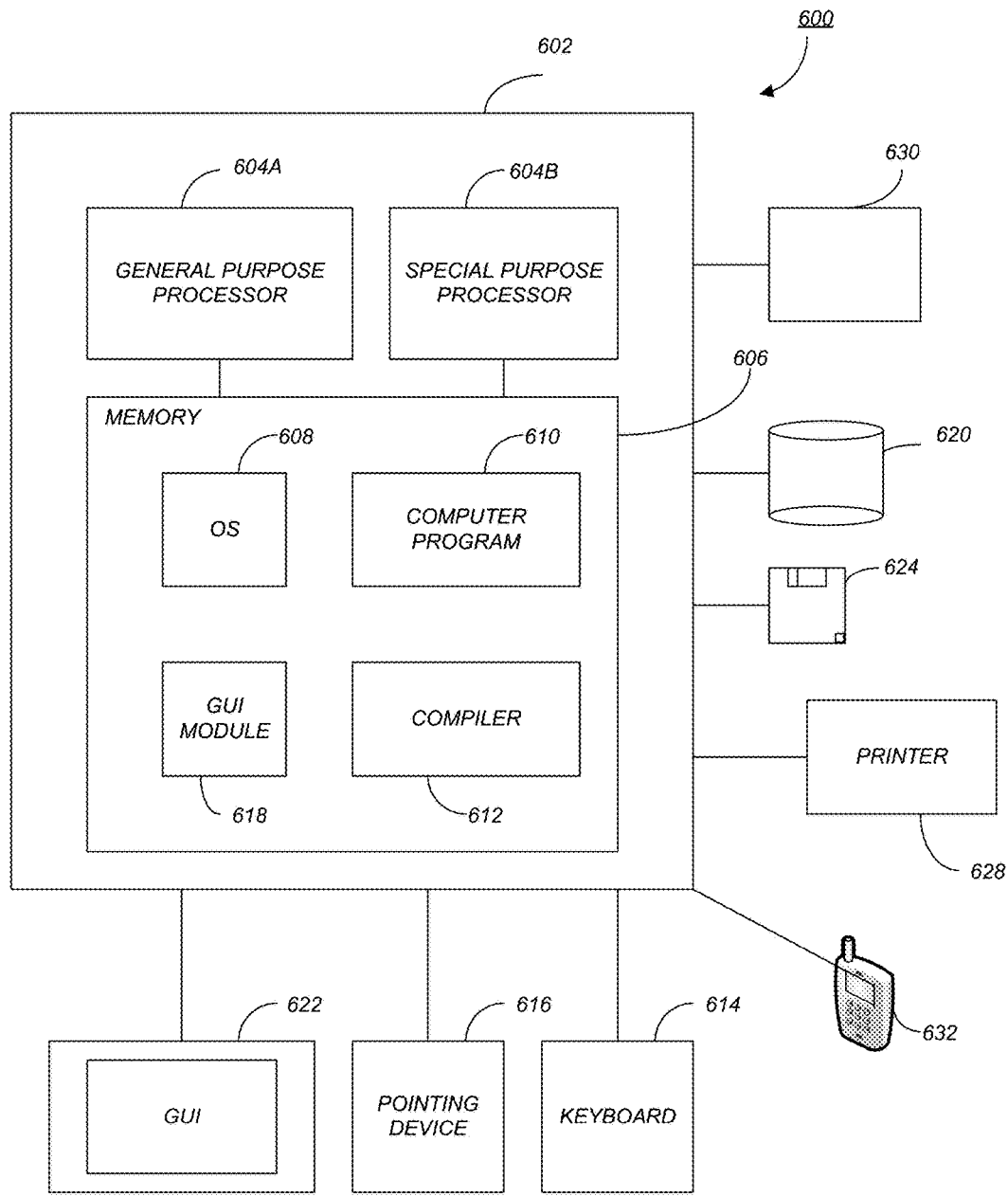
FIG. 6 is an exemplary hardware and software environment used to implement one or more embodiments of the invention.

FIG. 6 is an exemplary hardware and software environment 600 used to implement one or more embodiments of the invention. The hardware and software environment includes a computer 602 and may include peripherals. Computer 602 may be a user/client computer, server computer, or may be a database computer. The computer 602 comprises a general purpose hardware processor 604A and/or a special purpose hardware processor 604B (hereinafter alternatively collectively referred to as processor 604) and a memory 606, such as random access memory (RAM). The computer 602 may be coupled to, and/or integrated with, other devices, including input/output (I/O) devices such as a keyboard 614, a cursor control device 616 (e.g., a mouse, a pointing device, pen and tablet, touch screen, multi-touch device, etc.) and a printer 628. In one or more embodiments, computer 602 may be coupled to, or may comprise, a portable or media viewing/listening device 632 (e.g., an MP3 player, iPod™, Nook™, portable digital video player, cellular device, personal digital assistant, etc.). In yet another embodiment, the computer 602 may comprise a multi-touch device, mobile phone, gaming system, internet enabled television, television set top box, or other internet enabled device executing on various platforms and operating systems.

In one embodiment, the computer 602 operates by the general purpose processor 604A performing instructions defined by the computer program 610 under control of an operating system 608. The computer program 610 and/or the operating system 608 may be stored in the memory 606 and may interface with the user and/or other devices to accept input and commands and, based on such input and commands and the instructions defined by the computer program 610 and operating system 608, to provide output and results.

Output/results may be presented on the display 622 or provided to another device for presentation or further processing or action. In one embodiment, the display 622 comprises a liquid crystal display (LCD) having a plurality of separately addressable liquid crystals. Alternatively, the display 622 may comprise a light emitting diode (LED) display having clusters of red, green and blue diodes driven together to form full-color pixels. Each liquid crystal or pixel of the display 622 changes to an opaque or translucent state to form a part of the image on the display in response to the data or information generated by the processor 604 from the application of the instructions of the computer program 610 and/or operating system 608 to the input and commands. The image may be provided through a graphical user interface (GUI) module 618. Although the GUI module 618 is depicted as a separate module, the instructions performing the GUI functions can be resident or distributed in the operating system 608, the computer program 610, or implemented with special purpose memory and processors.

In one or more embodiments, the display 622 is integrated with/into the computer 602 and comprises a multi-touch device having a touch sensing surface (e.g., track pod or touch screen) with the ability to recognize the presence of two or more points of contact with the surface. Examples of multi-touch devices include mobile devices (e.g., iPhone™, Nexus S™, Droid™ devices, etc.), tablet computers (e.g., iPad™, HP Touchpad™), portable/handheld game/music/video player/console devices (e.g., iPod Touch™, MP3 players, Nintendo 3DS™, PlayStation Portable™, etc.), touch tables, and walls (e.g., where an image is projected through acrylic and/or glass, and the image is then backlit with LEDs).

Some or all of the operations performed by the computer 602 according to the computer program 610 instructions may be implemented in a special purpose processor 604B. In this embodiment, the some or all of the computer program 610 instructions may be implemented via firmware instructions stored in a read only memory (ROM), a programmable read only memory (PROM) or flash memory within the special purpose processor 604B or in memory 606. The special purpose processor 604B may also be hardwired through circuit design to perform some or all of the operations to implement the present invention. Further, the special purpose processor 604B may be a hybrid processor, which includes dedicated circuitry for performing a subset of functions, and other circuits for performing more general functions such as responding to computer program 610 instructions. In one embodiment, the special purpose processor 604B is an application specific integrated circuit (ASIC).

The computer 602 may also implement a compiler 612 that allows an application or computer program 610 written in a programming language such as COBOL, Pascal, C++, FORTRAN, or other language to be translated into processor 604 readable code. Alternatively, the compiler 612 may be an interpreter that executes instructions/source code directly, translates source code into an intermediate representation that is executed, or that executes stored precompiled code. Such source code may be written in a variety of programming languages such as Java™, Perl™, Basic™, etc. After completion, the application or computer program 610 accesses and manipulates data accepted from I/O devices and stored in the memory 606 of the computer 602 using the relationships and logic that were generated using the compiler 612.

The computer 602 also optionally comprises an external communication device such as a modem, satellite link, Ethernet card, or other device for accepting input from, and providing output to, other computers 602.

In one embodiment, instructions implementing the operating system 608, the computer program 610, and the compiler 612 are tangibly embodied in a non-transient computer-readable medium, e.g., data storage device 620, which could include one or more fixed or removable data storage devices, such as a zip drive, floppy disc drive 624, hard drive, CD-ROM drive, tape drive, etc. Further, the operating system 608 and the computer program 610 are comprised of computer program 610 instructions which, when accessed, read and executed by the computer 602, cause the computer 602 to perform the steps necessary to implement and/or use the present invention or to load the program of instructions into a memory 606, thus creating a special purpose data structure causing the computer 602 to operate as a specially programmed computer executing the method steps described herein. Computer program 610 and/or operating instructions may also be tangibly embodied in memory 606 and/or data communications devices 630, thereby making a computer program product or article of manufacture according to the invention. As such, the terms "article of manufacture," "program storage device," and "computer program product," as used herein, are intended to encompass a computer program accessible from any computer readable device or media.

Of course, those skilled in the art will recognize that any combination of the above components, or any number of different components, peripherals, and other devices, may be used with the computer 602.

Figure 7:
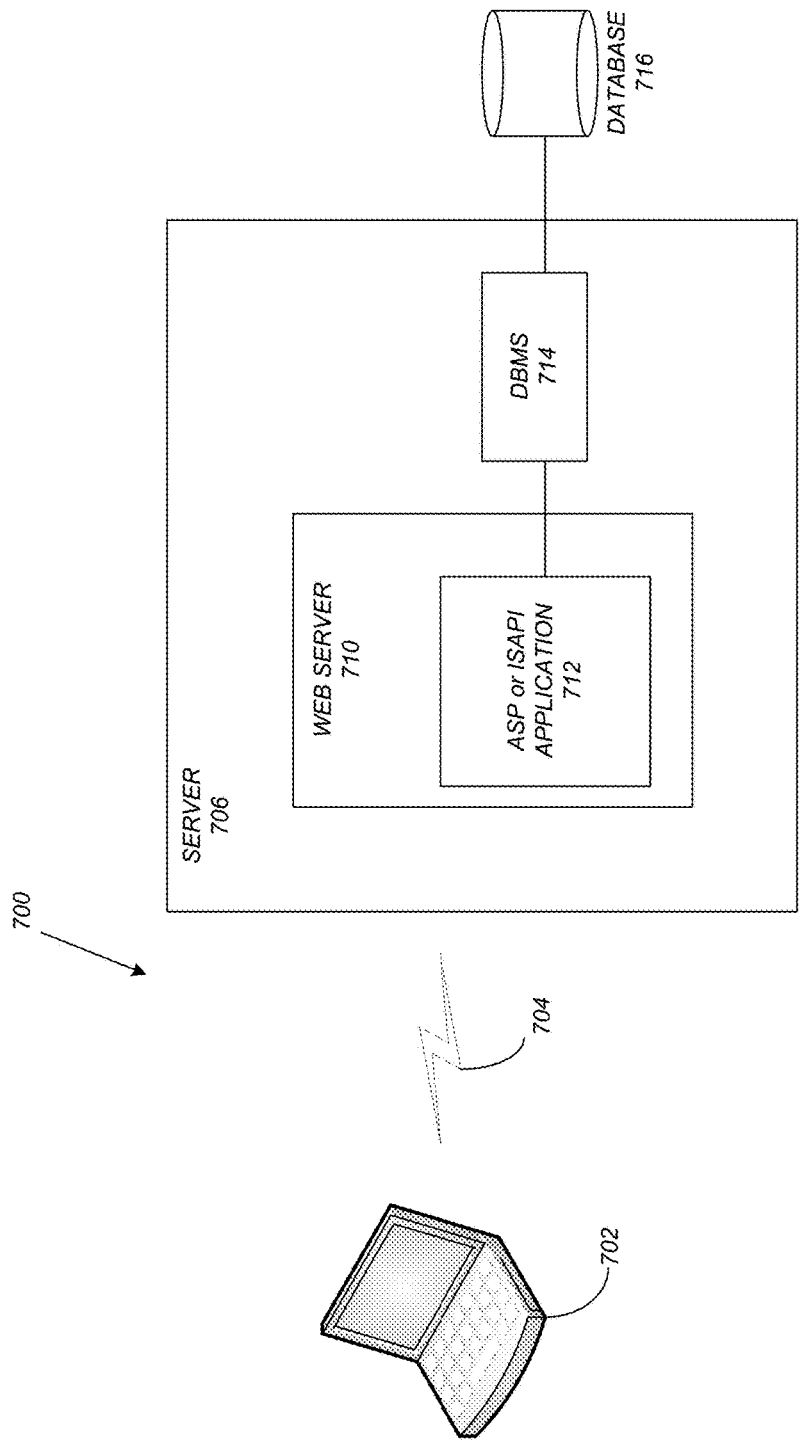
FIG. 7 schematically illustrates a typical distributed computer system using a network to connect client computers to server computers in accordance with one or more embodiments of the invention.

FIG. 7 schematically illustrates a typical distributed computer system 700 using a network 704 to connect client computers 702 to server computers 706. A typical combination of resources may include a network 704 comprising the Internet, LANs (local area networks), WANs (wide area networks), SNA (systems network architecture) networks, or the like, clients 702 that are personal computers or workstations (as set forth in FIG. 6), and servers 706 that are personal computers, workstations, minicomputers, or mainframes (as set forth in FIG. 6). However, it may be noted that different networks such as a cellular network (e.g., GSM [global system for mobile communications] or otherwise), a satellite based network, or any other type of network may be used to connect clients 702 and servers 706 in accordance with embodiments of the invention.

A network 704 such as the Internet connects clients 702 to server computers 706. Network 704 may utilize ethernet, coaxial cable, wireless communications, radio frequency (RF), etc. to connect and provide the communication between clients 702 and servers 706. Clients 702 may execute a client application or web browser and communicate with server computers 706 executing web servers 710. Such a web browser is typically a program such as MICROSOFT INTERNET EXPLORER™, MOZILLA FIREFOX™, OPERA™, APPLE SAFARI™, GOOGLE CHROME™, etc. Further, the software executing on clients 702 may be downloaded from server computer 706 to client computers 702 and installed as a plug-in or ACTIVEX™ control of a web browser. Accordingly, clients 702 may utilize ACTIVEX™ components/component object model (COM) or distributed COM (DCOM) components to provide a user interface on a display of client 702. The web server 710 is typically a program such as MICROSOFT'S INTERNET INFORMATION SERVER™.

Web server 710 may host an Active Server Page (ASP) or Internet Server Application Programming Interface (ISAPI) application 712, which may be executing scripts. The scripts invoke objects that execute business logic (referred to as business objects). The business objects then manipulate data in database 716 through a database management system (DBMS) 714. Alternatively, database 716 may be part of, or connected directly to, client 702 instead of communicating/obtaining the information from database 716 across network 704. When a developer encapsulates the business functionality into objects, the system may be referred to as a component object model (COM) system. Accordingly, the scripts executing on web server 710 (and/or application 712) invoke COM objects that implement the business logic. Further, server 706 may utilize MICROSOFT'S™ Transaction Server (MTS) to access required data stored in database 716 via an interface such as ADO (Active Data Objects), OLE DB (Object Linking and Embedding DataBase), or ODBC (Open DataBase Connectivity).

Generally, these components 700-716 all comprise logic and/or data that is embodied in/or retrievable from device, medium, signal, or carrier, e.g., a data storage device, a data communications device, a remote computer or device coupled to the computer via a network or via another data communications device, etc. Moreover, this logic and/or data, when read, executed, and/or interpreted, results in the steps necessary to implement and/or use the present invention being performed.

Although the terms "user computer", "client computer", and/or "server computer" are referred to herein, it is understood that such computers 702 and 706 may be interchangeable and may further include thin client devices with limited or full processing capabilities, portable devices such as cell phones, notebook computers, pocket computers, multi-touch devices, and/or any other devices with suitable processing, communication, and input/output capability.

Of course, those skilled in the art will recognize that any combination of the above components, or any number of different components, peripherals, and other devices, may be used with computers 702 and 706.

Sweeping a Profile Along a Small Circular Arc of a Path

Embodiments of the invention are implemented as a software application on a client 702 or server computer 706. Further, as described above, the client 702 or server computer 706 may comprise a thin client device or a portable device that has a multi-touch-based display.

As described herein, embodiments of the invention provide the ability to sweep a large profile around small circular arcs of the path without resulting in self intersecting geometry. Some embodiments of the invention assume that the profile is planar (2D), the path is tangent-continuous, and the profile plane is perpendicular to the path.

Figure 8A:
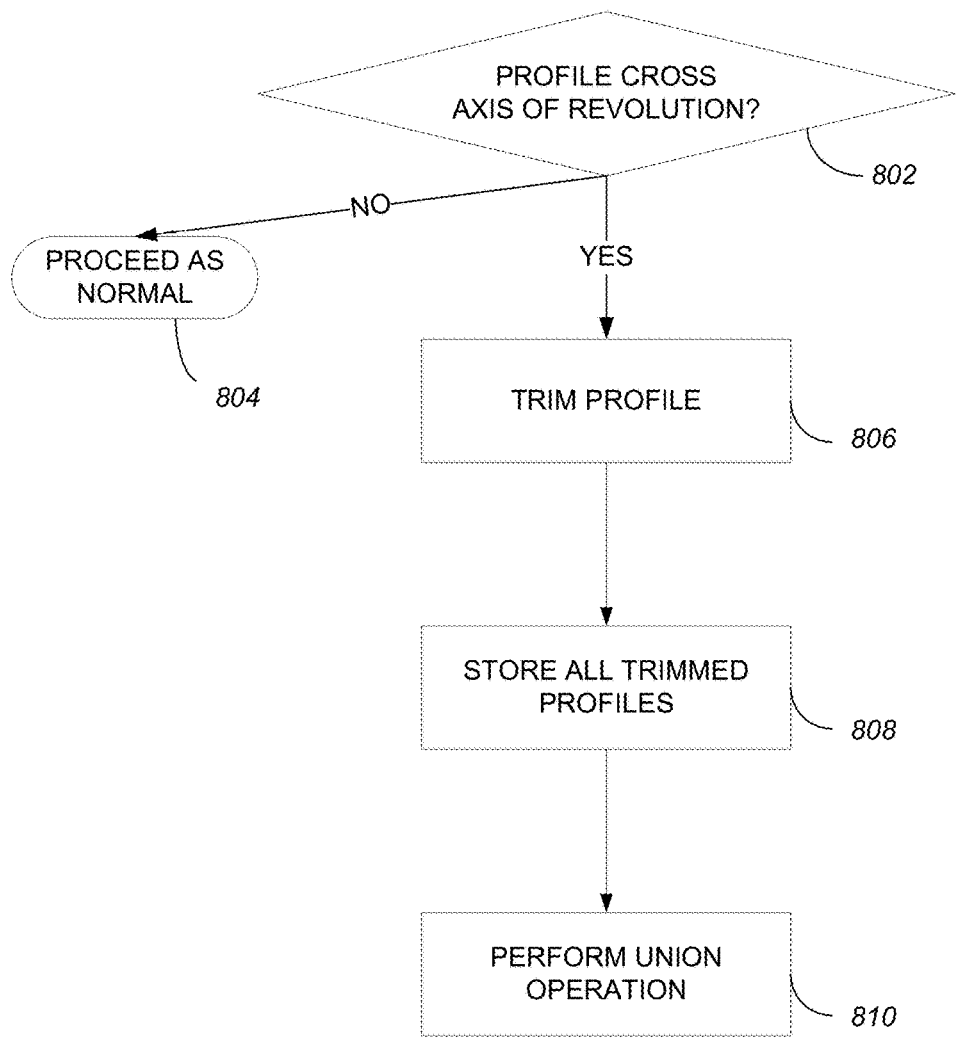
FIG. 8A is a flow chart illustrating the logical flow for sweeping a profile along a small circular arc of a path in accordance with one or more embodiments of the invention.

FIG. 8A is a flow chart illustrating the logical flow for sweeping a profile along a small circular arc of a path in accordance with one or more embodiments of the invention. At step 802, for each circular path segment, a determination is made regarding whether the profile crosses the axis of revolution at the start position of the path segment. If the profile does not cross the axis of revolution (at the start position), then the sweep operation may proceed in a normal manner at step 804.

If the profile crosses the axis of revolution, the profile is trimmed at step 806. All of the trimmed profiles are stored at step 808 while remembering which profile is needed for which path segment.

At step 810, one or more union operations are conducted (e.g., between various bodies from different path segments).

Steps 806 and 808 will be described in detail with reference to the figures to better understand the process.

Profile Trimming

Figure 8B:
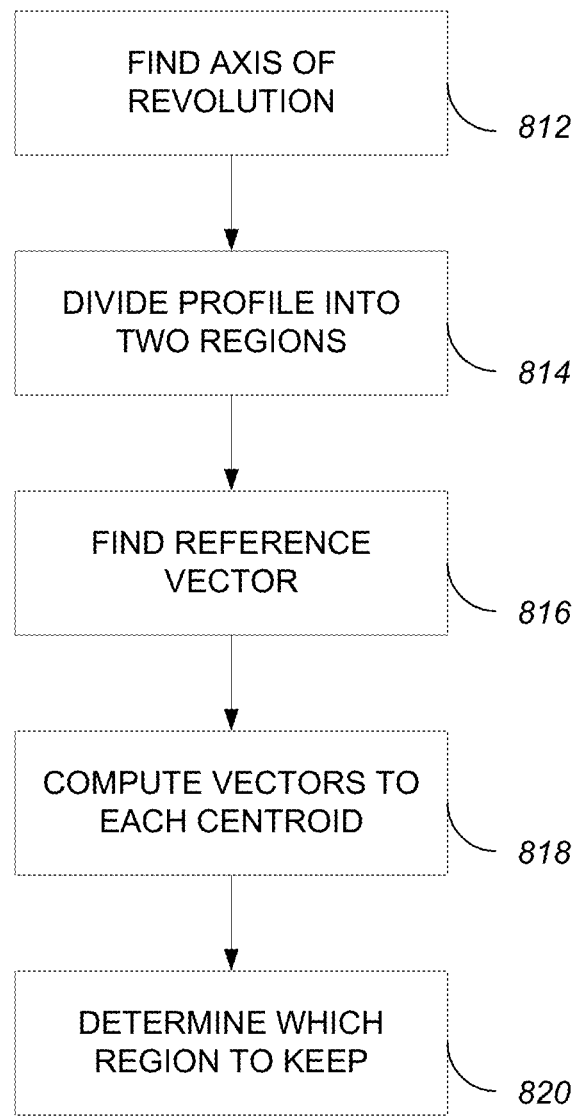
FIG. 8B illustrates the logical flow for the steps involved with trimming a profile in accordance with one or more embodiments of the invention.

Step 806 is the process of trimming the profile. FIG. 8B illustrates the logical flow for the steps involved with trimming the profile in accordance with one or more embodiments of the invention. Each of the steps will be described with reference to figures described herein.

Figure 9:
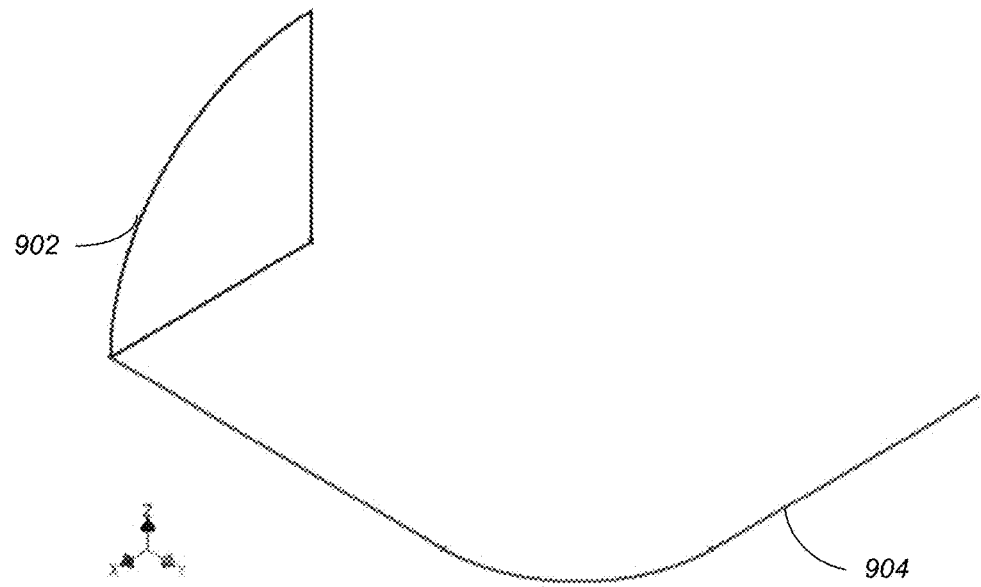
FIG. 9 illustrates a profile and a path used during a sweep operation in accordance with one or more embodiments of the invention.
Figure 10:
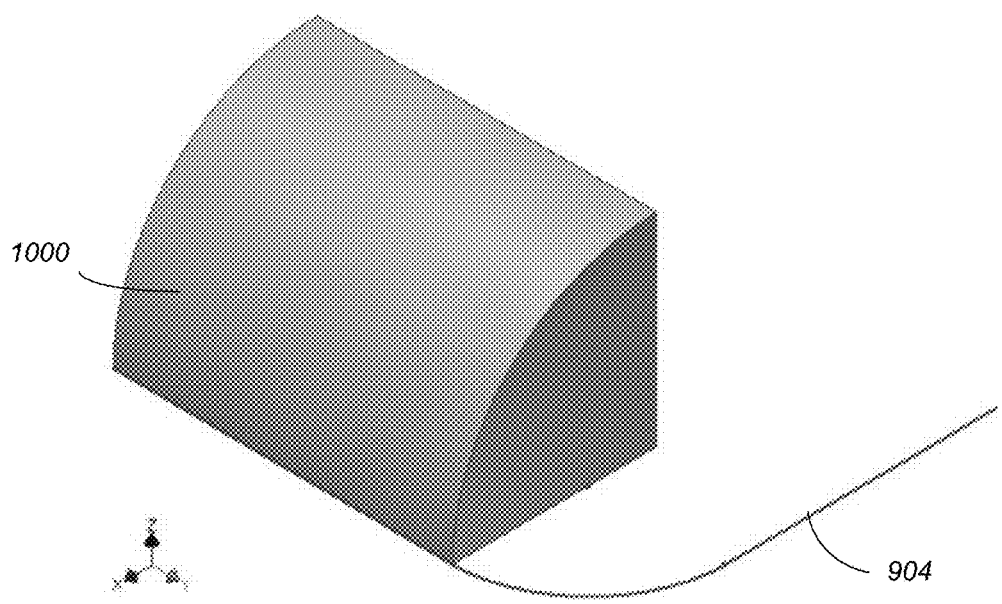
FIG. 10 illustrates a solid body resulting from a sweep of a profile 902 along a path until the start of a circular path segment in accordance with one or more embodiments of the invention.

FIG. 9 illustrates the profile 902 and path 904 that the profile 902 will be swept along. The sweep operation is conducted until the operation reaches the beginning/start of the circular path segment of path 904. FIG. 10 illustrates the resulting solid body 1000 when the profile 902 is swept along the path 904 until the start of the circular path segment.

Figure 11:
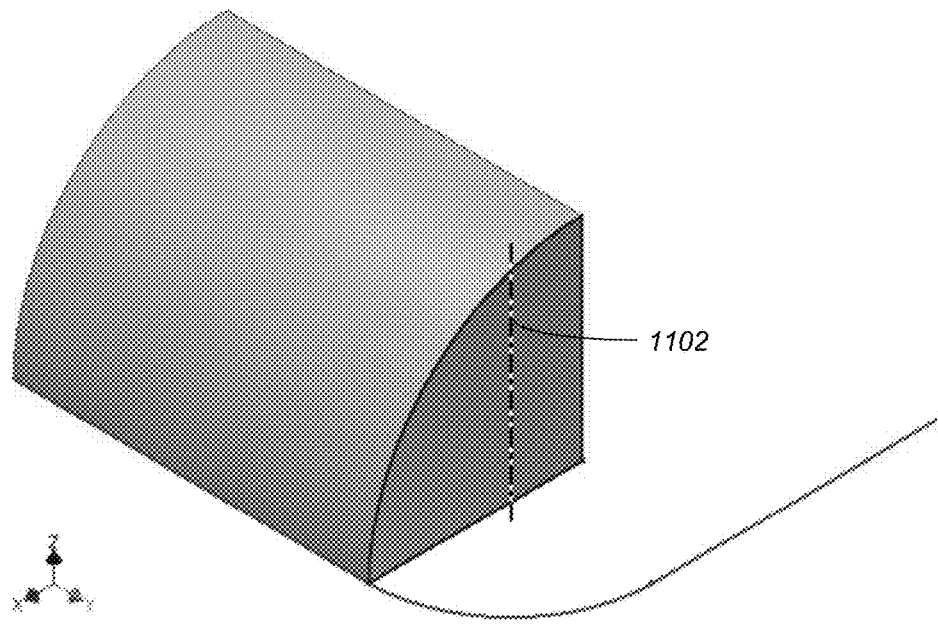
FIG. 11 illustrates an axis of revolution with the root of the axis located at the center of the circle in accordance with one or more embodiments of the invention.

At step 812, the axis of revolution (from the circular path segment) is found. FIG. 11 illustrates the axis of revolution 1102 with the root of the axis 1102 located at the center of the circle.

Figure 12:
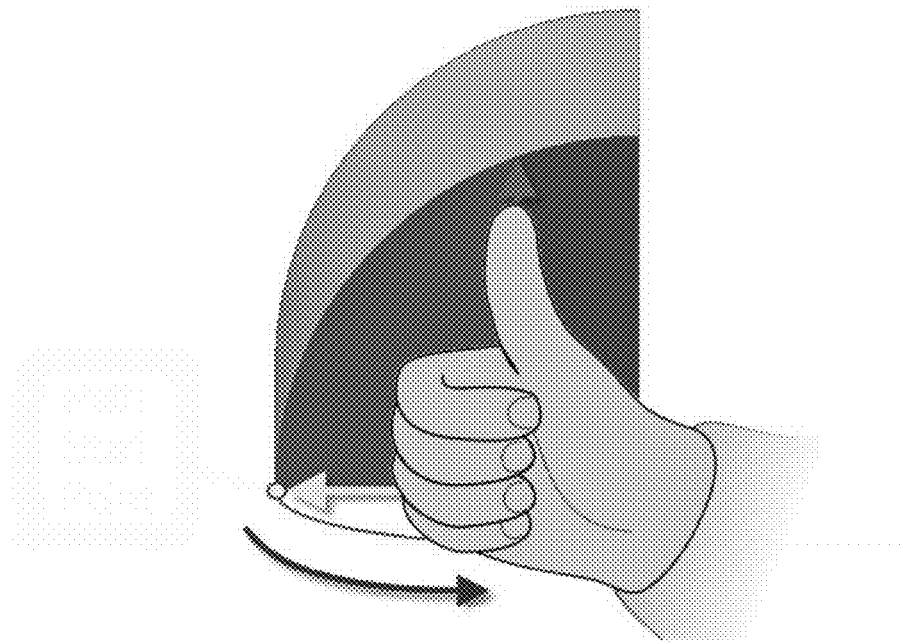
FIG. 12 illustrates the identification of the path direction and direction of axis of rotation using the right hand rule in accordance with one or more embodiments of the invention.
Figure 13:
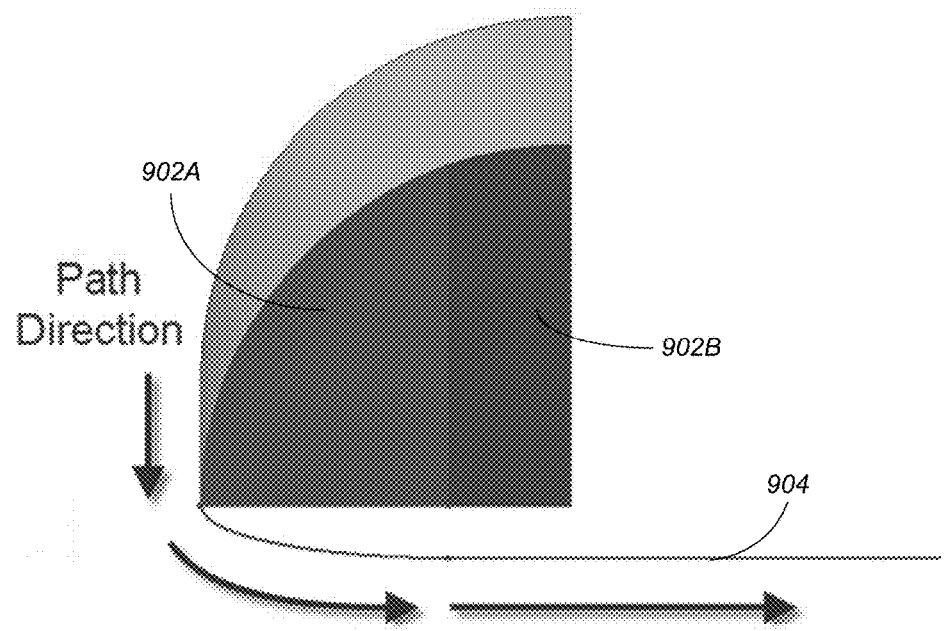
FIG. 13 illustrates two regions as well as the path direction for a path in accordance with one or more embodiments of the invention.
Figure 14:
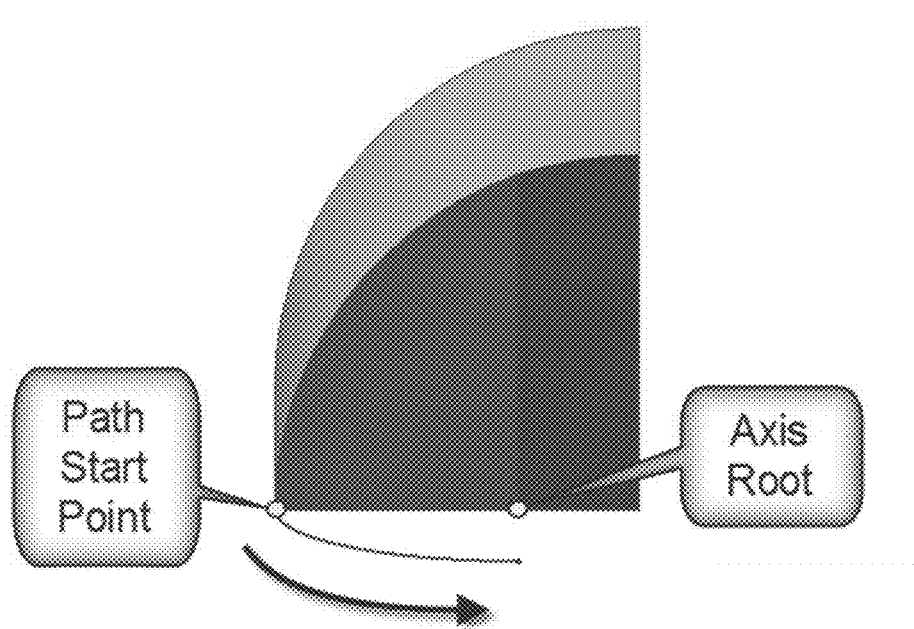
FIG. 14 illustrates the path start point as well as the axis root and path direction that has been identified in accordance with one or more embodiments of the invention.

At step 814, the axis of revolution 1102 is used to divide the profile 902 into two regions 902A and 902B. The path direction is also identified using the right hand rule as illustrated in FIG. 12. FIG. 13 illustrates the two regions 902A and 902B as well as the path direction for path 904. FIG. 14 illustrates the path start point as well as the axis root and path direction that has been identified. Accordingly, the root of the axis of revolution is the center of the circle, and the direction of the axis is the normal of the circle (considering path direction).

Figure 15:
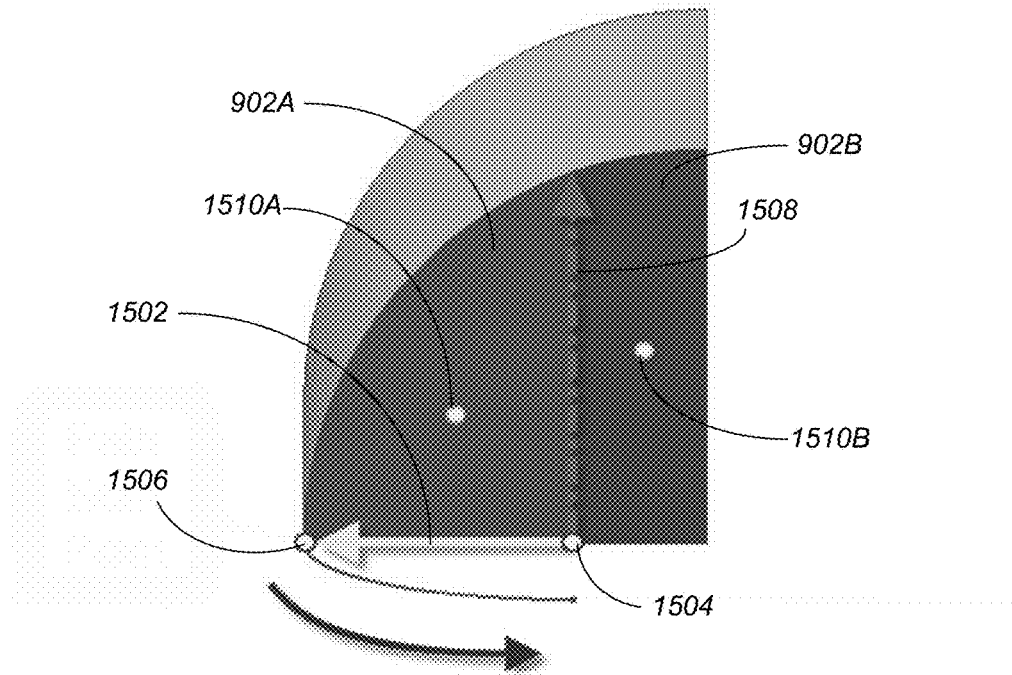
FIG. 15 illustrates a reference vector in accordance with one or more embodiments of the invention.

At step 816, a reference vector is determined/computed/found. As illustrated in FIG. 15, the reference vector 1502 has a direction that is from the root 1504 of the axis of revolution to the start point 1506 of the circular path segment (with the direction of the axis of revolution illustrated at 1508). Centroids 1510A and 1510B of each region 902A and 902B are also computed/determined.

Figure 16:
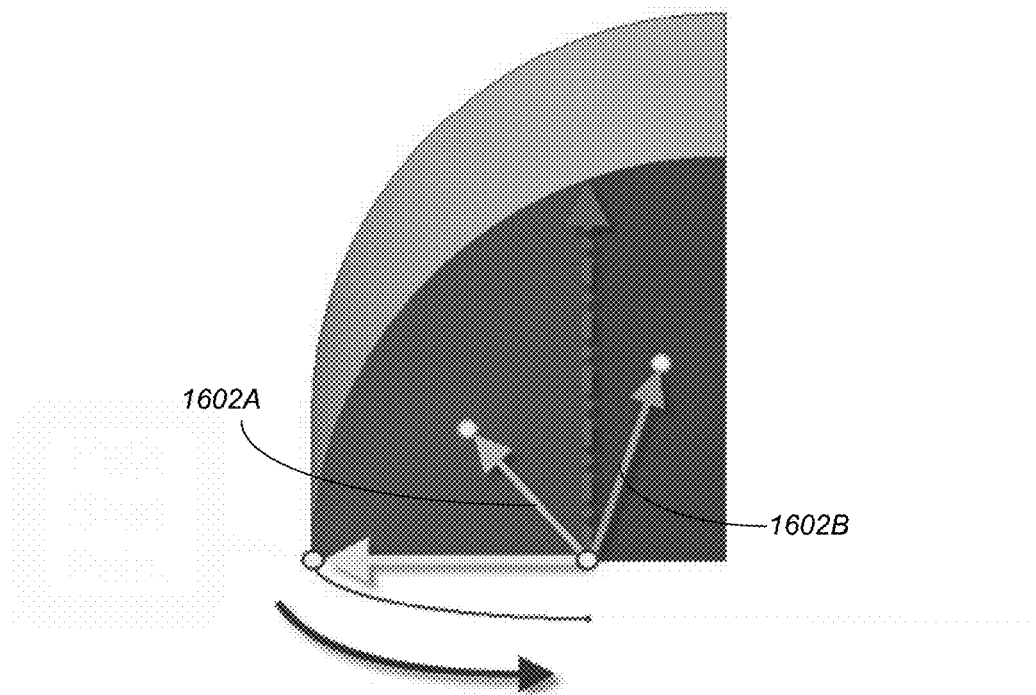
FIG. 16 illustrates two vectors that project from the axis root to the centroids in accordance with one or more embodiments of the invention.
Figure 17:
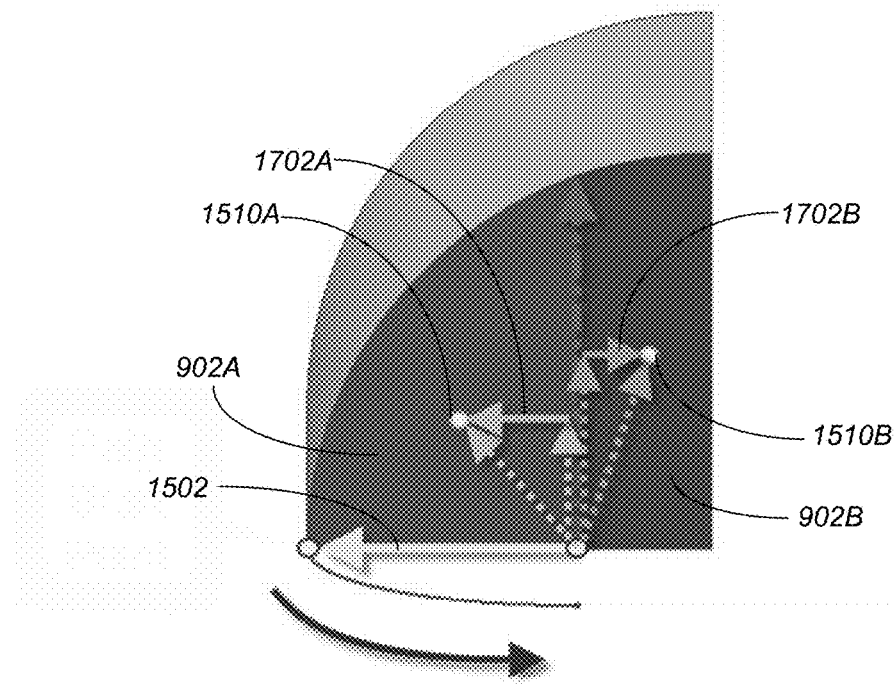
FIG. 17 illustrates additional vectors that are determined/projected based on the vectors from the axis root to the centroid in accordance with one or more embodiments of the invention.
Figure 18:
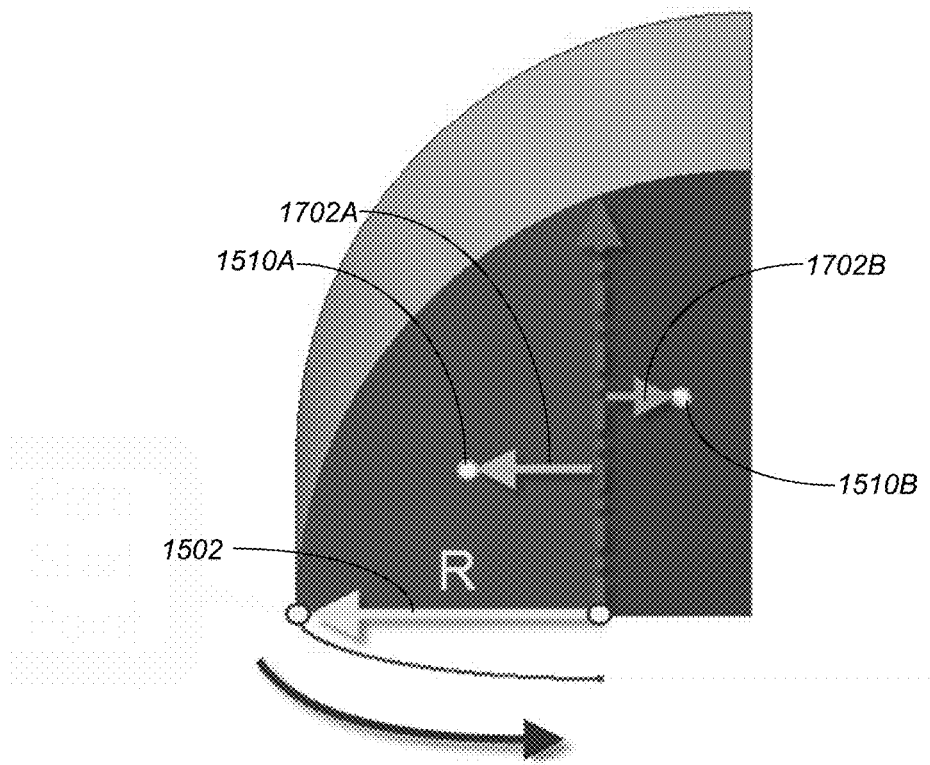
FIG. 18 illustrates the reference vector as well as the two additional vectors that project from the axis of rotation to the centroids in accordance with one or more embodiments of the invention.

At step 818, vectors to each of the centroids are determined/computed. FIG. 16 illustrates the two vectors 1602A and 1602B that project from the axis root 1504 to the centroids 1510A and 1510B. Referring to FIG. 17, based on the vectors 1602A/1602B from the axis root to the centroid, additional vectors are determined/projected: one vector 1702A that points to the centroid 1510A (of region 902A) and is perpendicular to the axis of revolution; and a second vector 1702B that points to the centroid 1510B (of region 902B) and is perpendicular to the axis of revolution. FIG. 18 illustrates the reference vector 1502 as well as the two vectors 1702A and 1702B that project from the axis of rotation to the centroids.

Figure 19:
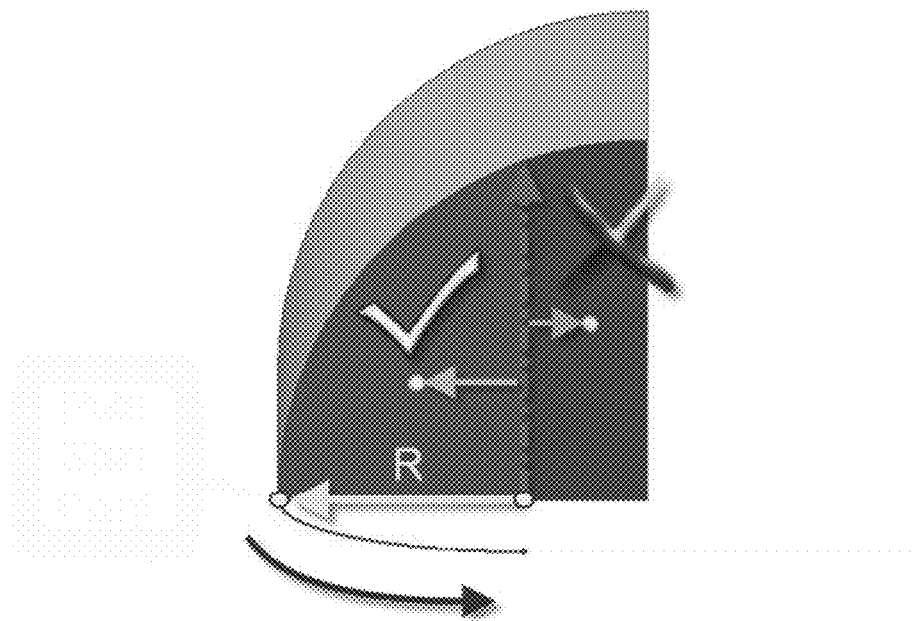
FIG. 19 illustrates a determination of which region to maintain and which region to remove based on a comparison of the reference vector to the projected vectors of FIG. 18 in accordance with one or more embodiments of the invention.

At step 820, a determination is made regarding which region 902A/902B to keep and which to remove/discard. To make such a determination, vectors 1702A and 1702B are compared to the reference vector 1502. If vector 1702A points in the same direction as vector 1502, region 902A is kept and region 902B is removed/discarded. If vector 1702B points in the same direction as reference vector 1502, region 902B is kept and region 902A is removed/discarded. FIG. 19 illustrates such a determination. To determine whether two vectors are oriented in the same direction, the dot product of the vectors may be utilized.

Union Operations

Figure 20:
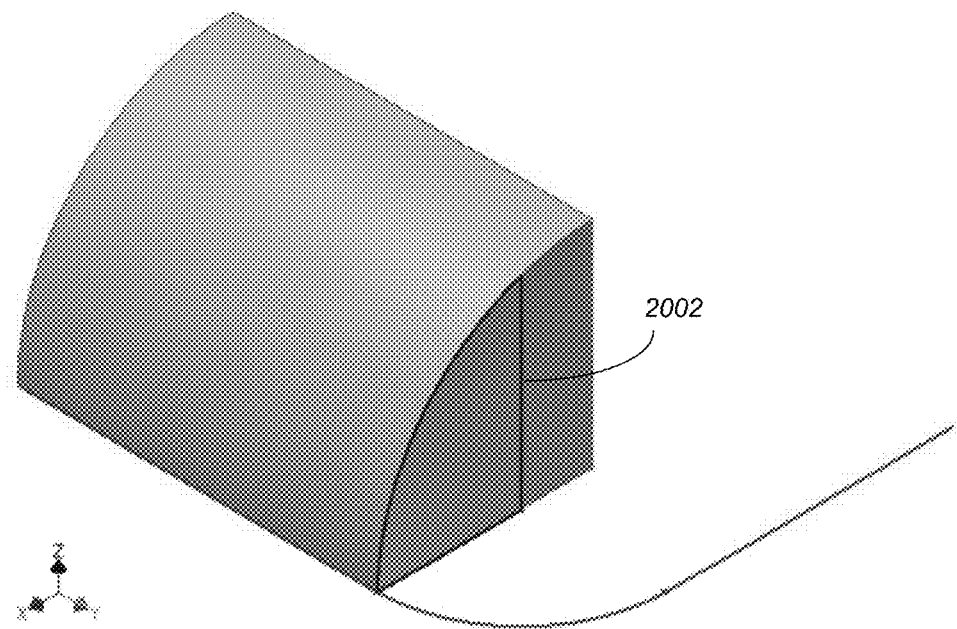
FIG. 20 illustrates a resulting solid body, the profile, and the path from a sweep operation of the profile to the start point of the circular arc in accordance with one or more embodiments of the invention.
Figure 21:
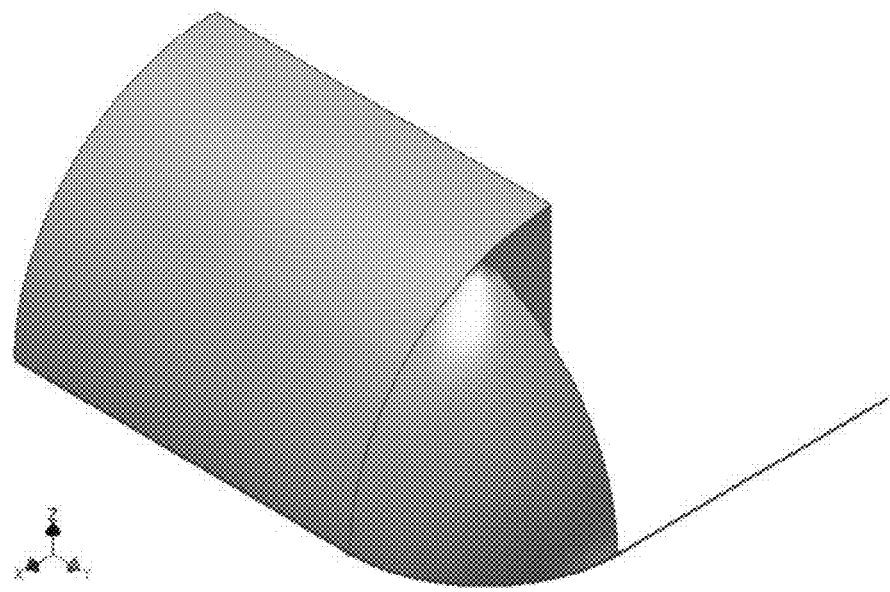
FIG. 21 illustrates the resulting solid body when a sweep operation is conducted to the end of the circular portion of the path in accordance with one or more embodiments of the invention.
Figure 22:
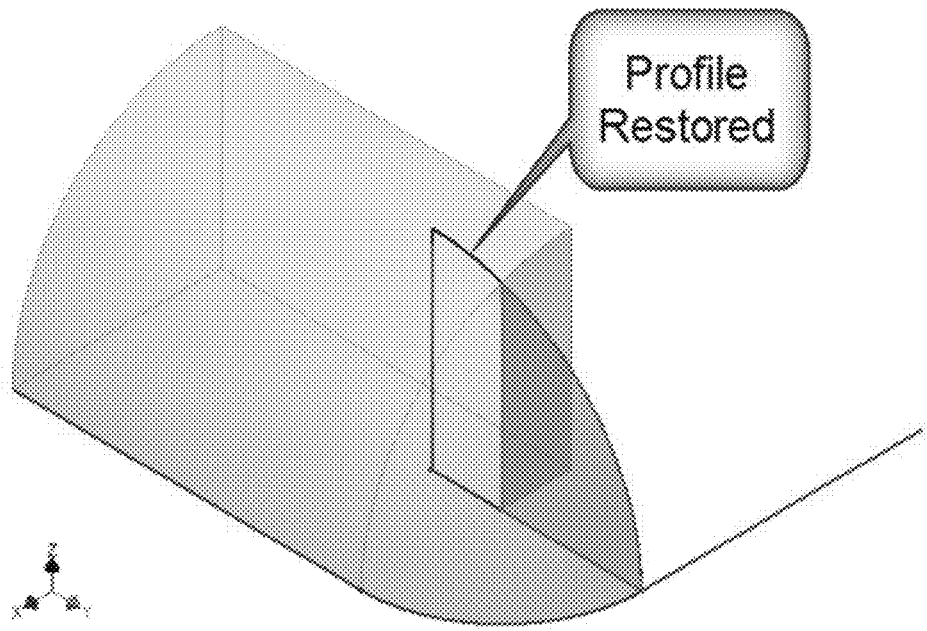
FIG. 22 illustrates a transparent view of the sweep operation along with a restored profile in accordance with one or more embodiments of the invention.
Figure 23:
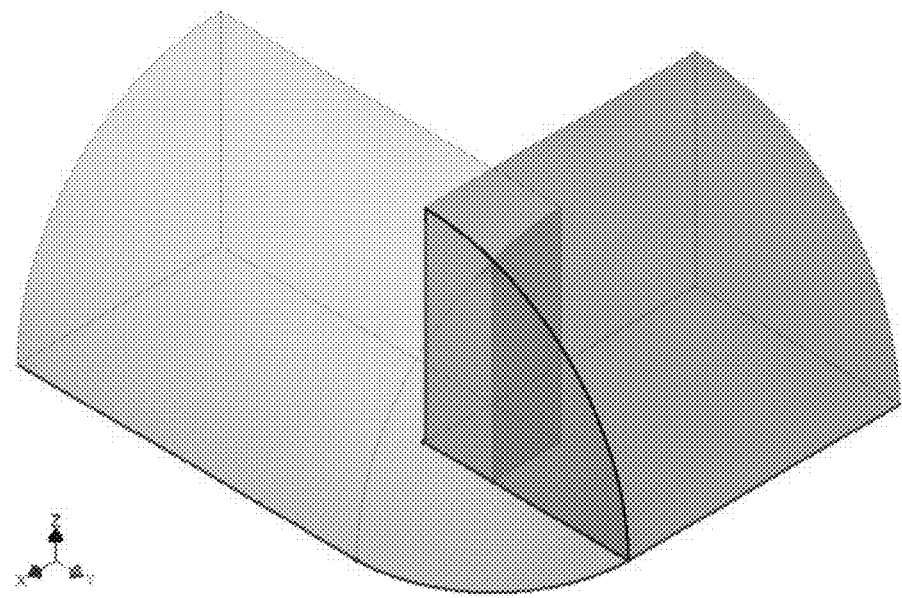
FIG. 23 illustrates a transparent view of a completed sweep operation.
Figure 24:
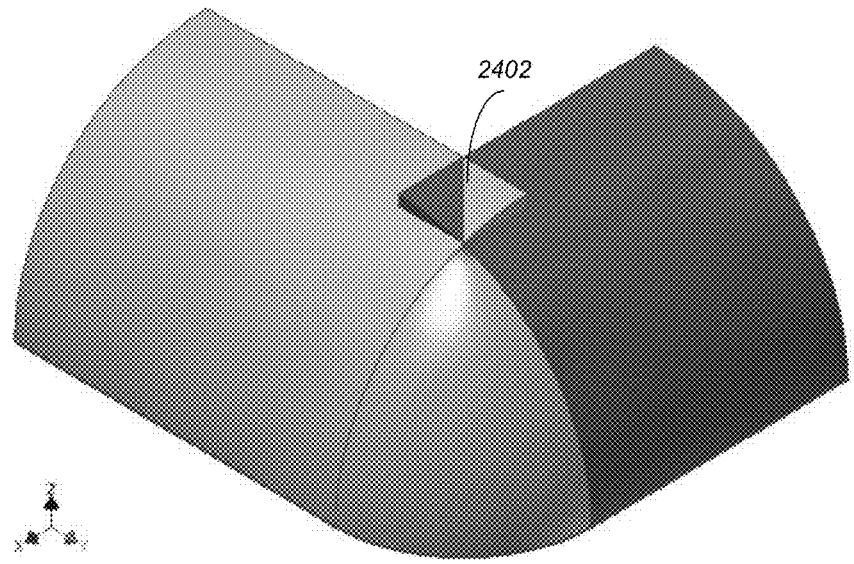
FIG. 24 illustrates a resulting solid body with undesirable artifacts based on the sweep operation illustrated in FIG. 23.

If the trimmed profiles were swept along the path using the regular union operations, undesirable artifacts (and/or an error) in the completed solid model may result. As set forth herein, a regular Boolean union operation is performed between a blank body along all previous path segments up to the small circular segment and a tool body along the current path segment. For example, as illustrated in FIG. 20, the profile is swept to the start point of the circular arc, and per the above, one region is removed from the profile leaving profile 2002 to complete the sweep along the arc segment along the circular portion of the path. The result of sweeping the remaining portion of the profile after the circular portion of the path has been swept is illustrated in FIG. 21. The original profile is then restored as illustrated in FIG. 22. The sweep operation continues as illustrated in FIG. 23 with the result illustrated in FIG. 24. As shown, there are undesirable artifacts 2402.

Figure 8C:
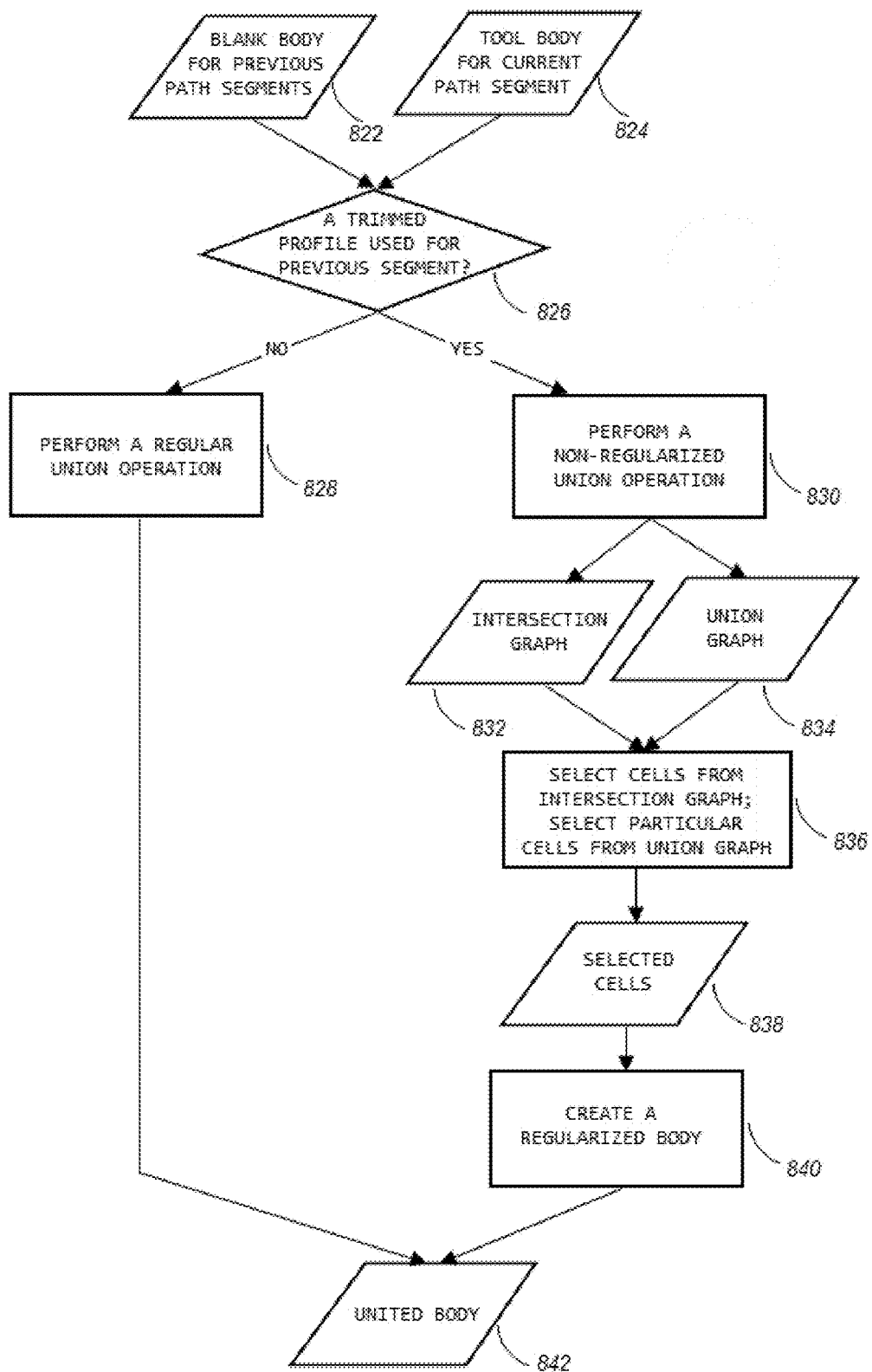
FIG. 8C illustrates the logical flow for performing the non-regularized Boolean union operations in accordance with one or more embodiments of the invention.

To avoid the artifacts 2402 and/or an error during processing, at step 810 of FIG. 8A, embodiments of the invention perform various non-regularized union operations (on the stored trimmed profiles). As set forth herein, a selective Boolean union operation (also referred to as a selective union operation) is performed between a blank body along all previous path segments up to the small circular segment and a tool body along the current path segment. In other words, a selective union operation is performed that joins the solid bodies from the trimmed profiles. FIG. 8C illustrates the logical flow for performing the selective Boolean union operations in accordance with one or more embodiments of the invention.

Figure 25:
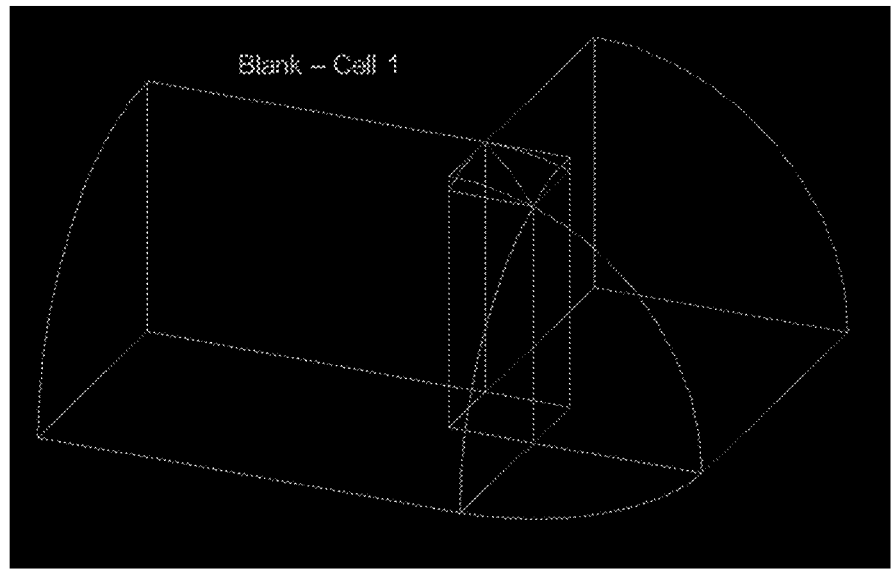
FIGS. 25-27 illustrate the three blank body cells resulting from the sweep operation along all previous path segments up to the end of the circular arc of the path in accordance with one or more embodiments of the invention.
Figure 26:
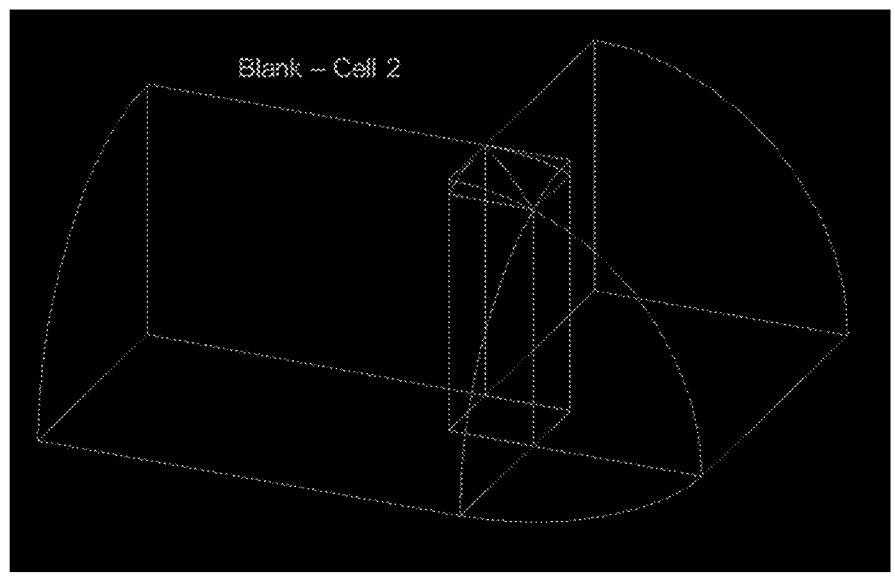
Figure 27:
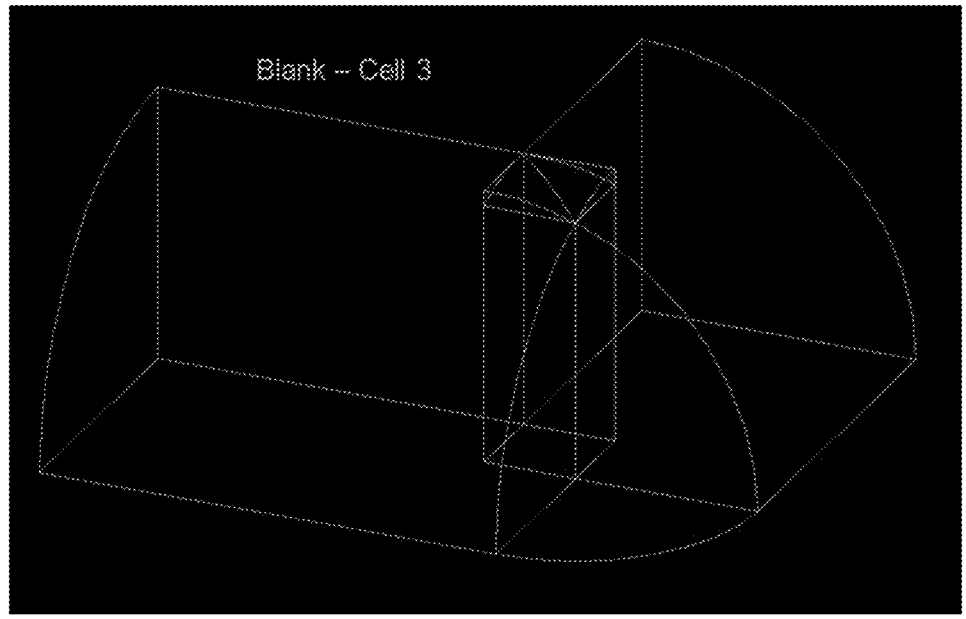
Figure 28:
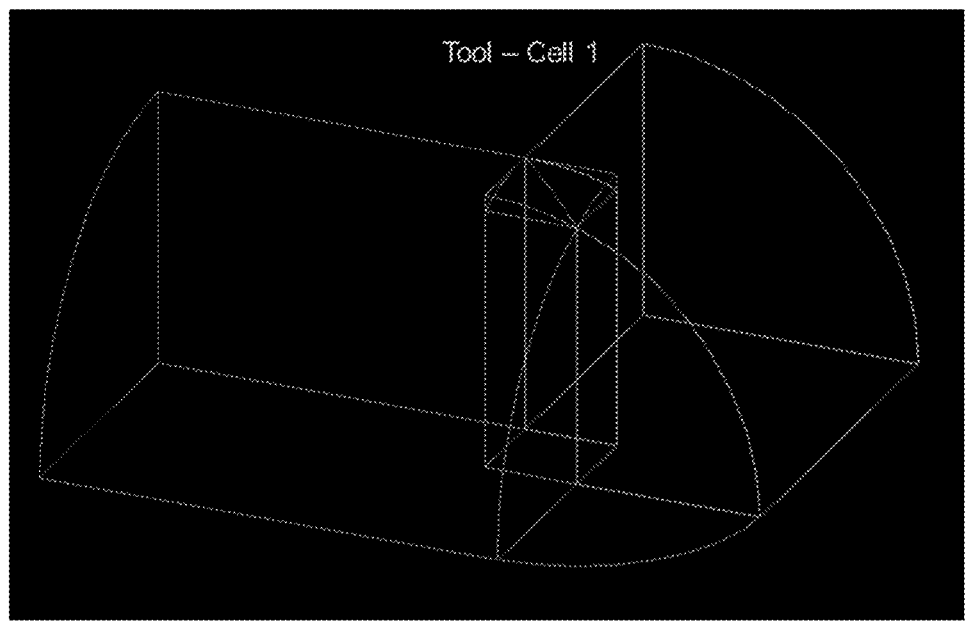
FIGS. 28-30 illustrate the three tool body cells created (i.e., starting from the end of the circular arc segment to the end of the path) in accordance with one or more embodiments of the invention.
Figure 29:
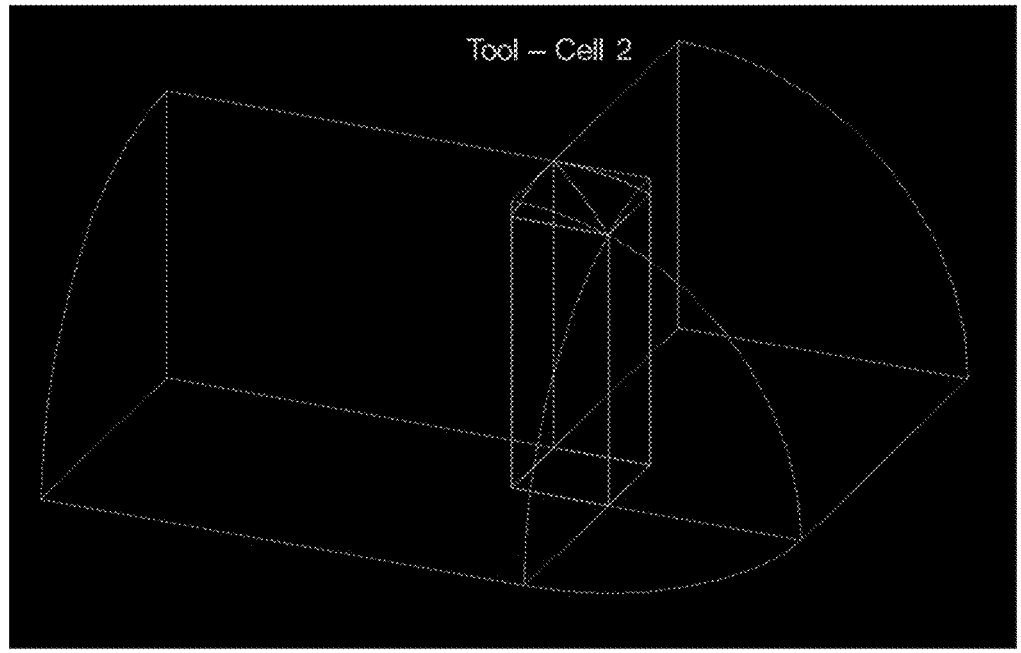
Figure 30:
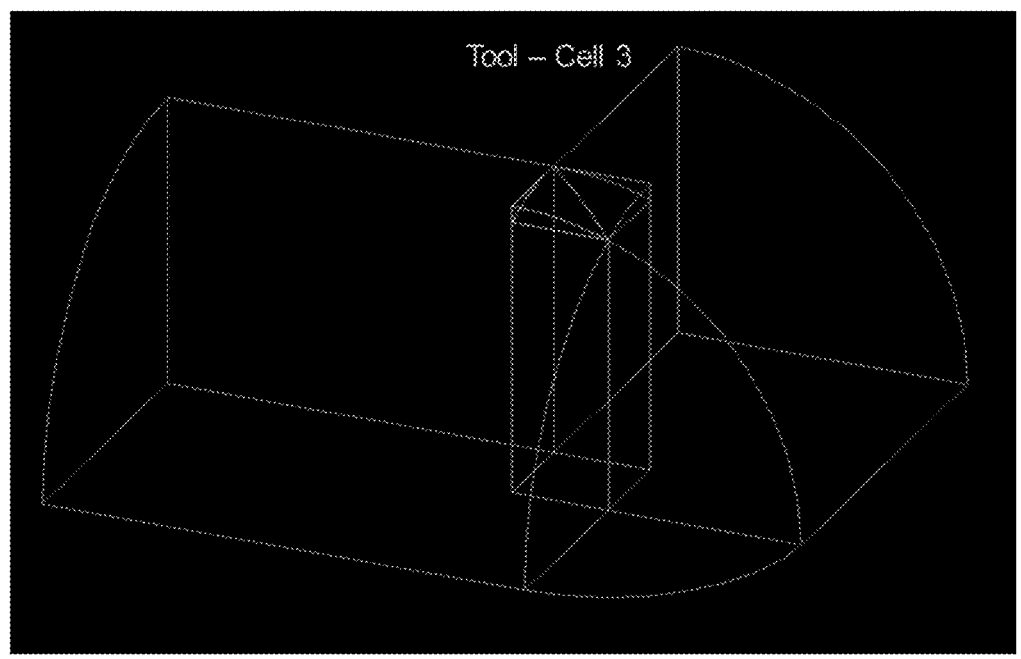

As the profile is swept along each path segment, the blank body from the previous path segment 822 is united with the tool body for the current path segment 824. The result of the union is a new blank body 842. FIGS. 25-27 illustrate the three cells in the blank body resulting from the sweep operation along all previous path segments up to the end of the circular arc of the path. FIGS. 28-30 illustrate the three tool body cells created along the current path segment starting from the end of the circular arc segment.

A determination is made at step 826 regarding whether a trimmed profile is used. If a trimmed profile is not used, a regular Boolean operation is performed at step 828. If a trimmed profile is used, the blank and tool bodies are selectively united via steps 830-840.

Figure 31:
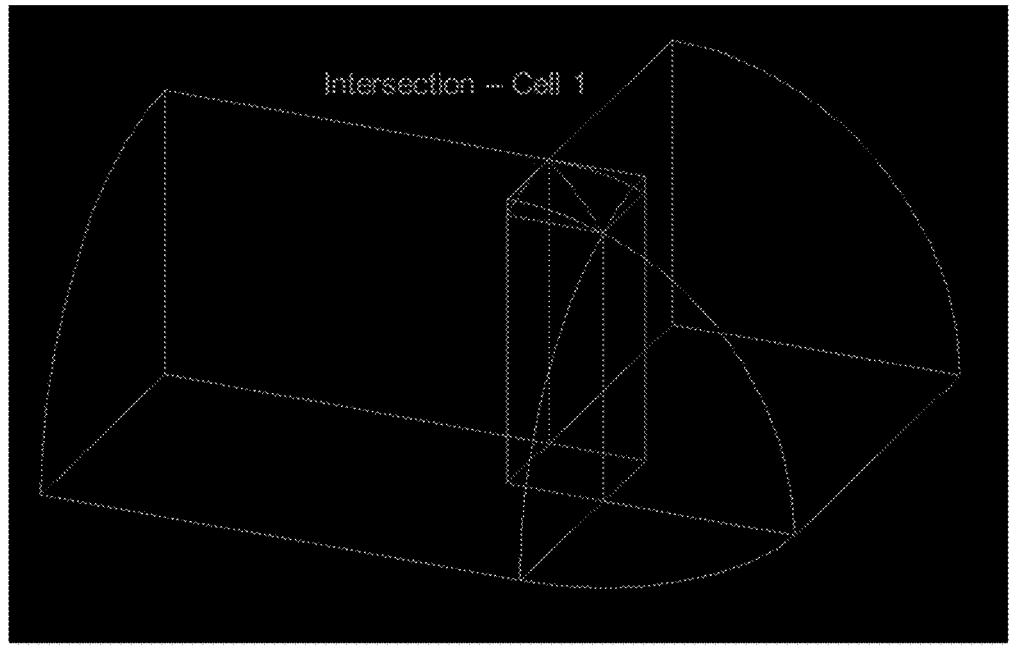
FIG. 31 illustrates the intersection of the blank and tool bodies in accordance with one or more embodiments of the invention.
Figure 32:
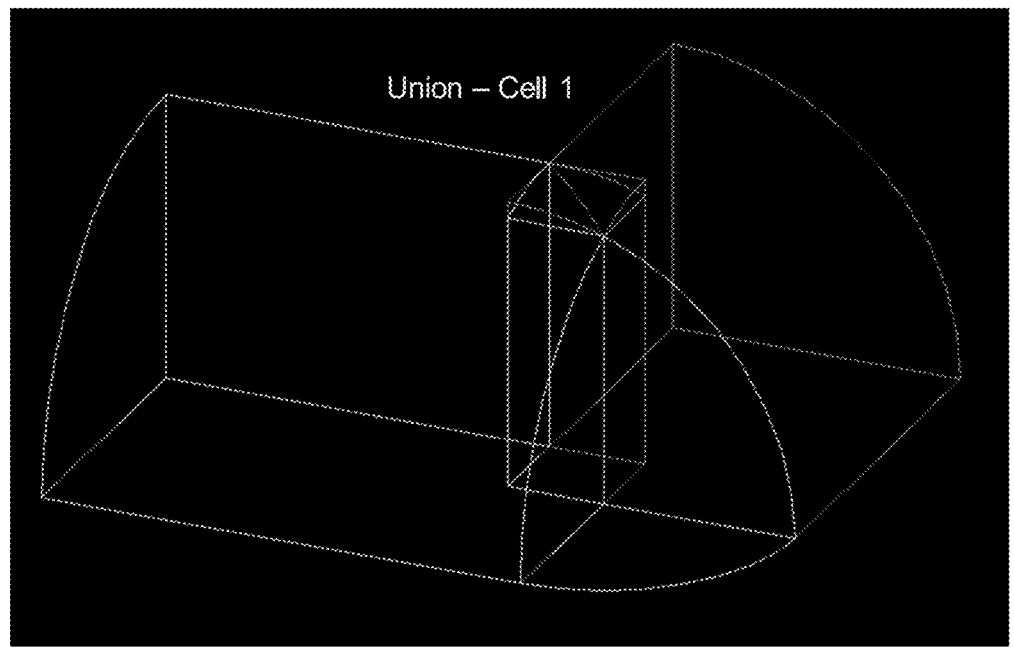
FIGS. 32-36 illustrate the non-regularized union of the blank and tool bodies in accordance with one or more embodiments of the invention.
Figure 33:
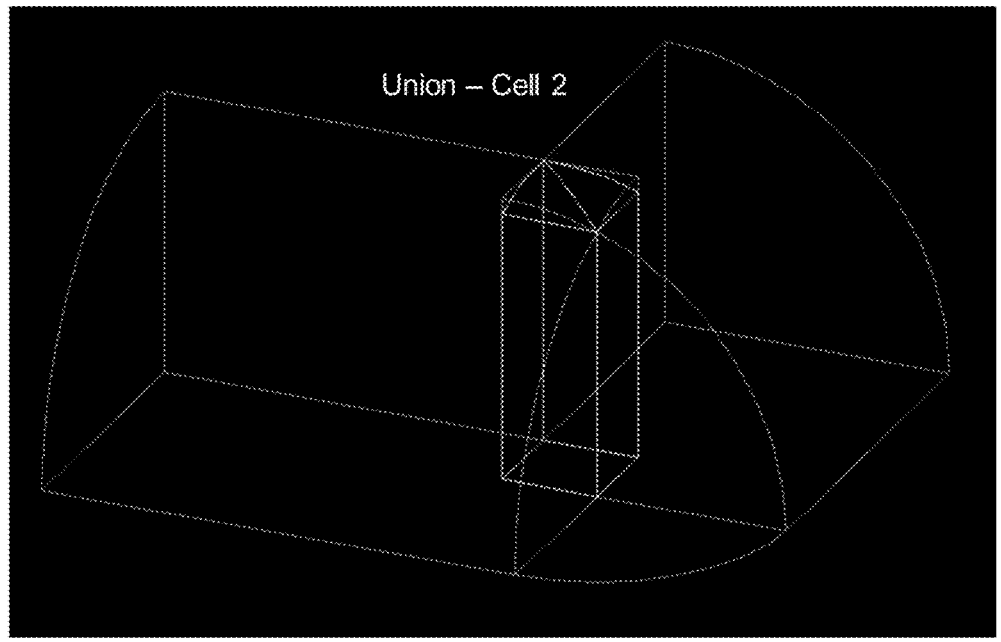
Figure 34:
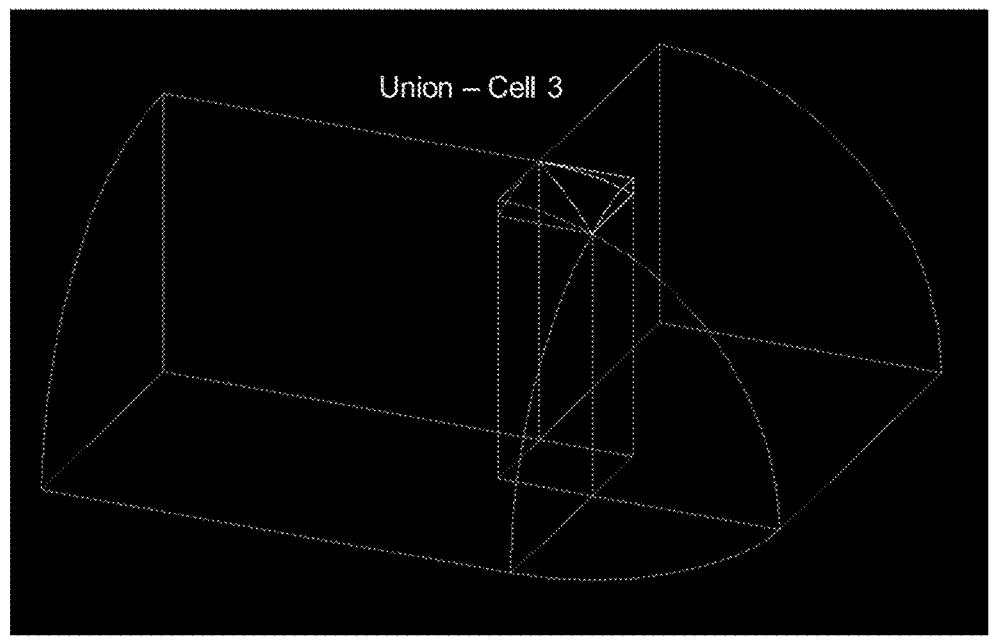
Figure 35:
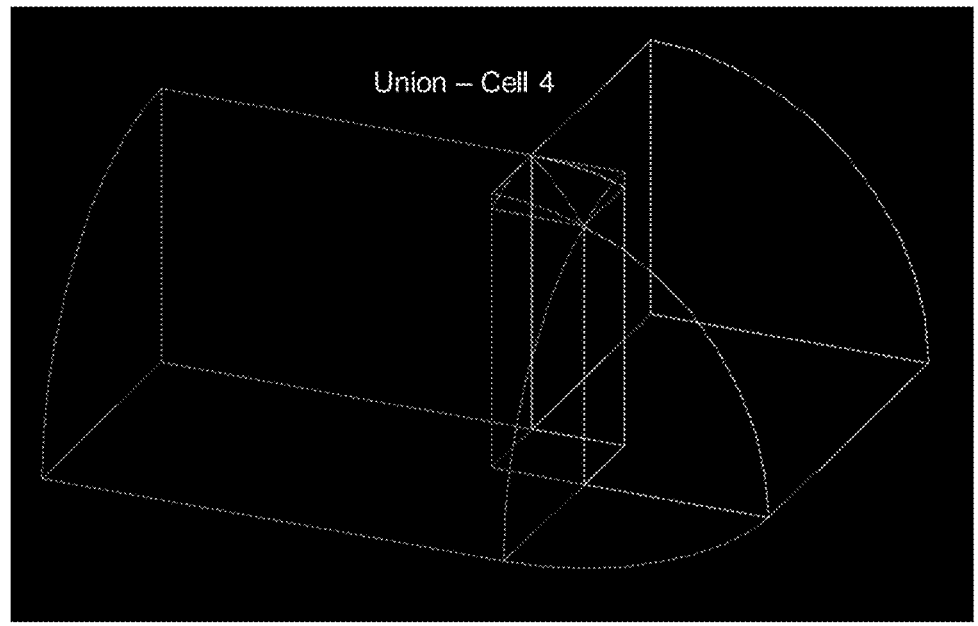
Figure 36:
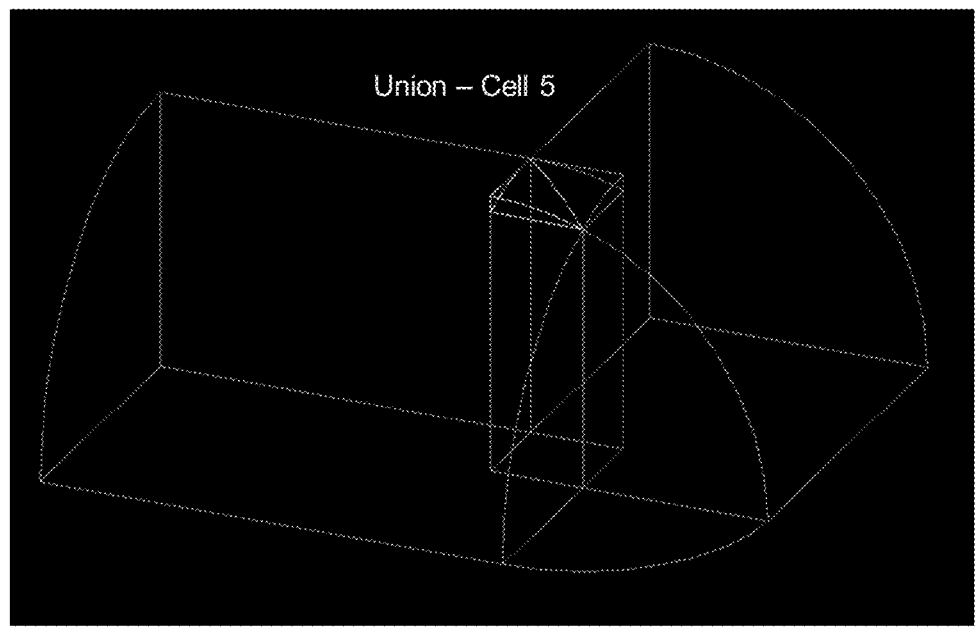

At step 830, a non-regularized union (i.e., a selective union operation) of the two bodies is performed and the cellular topology is attached to the result (which consists of intersection graph 832 and union graph 834). FIG. 31 illustrates the intersection graph 832 of the two bodies. In this example, the intersection graph 832 contains only one cell. FIGS. 32-36 illustrate the five cells in the union graph 834. In this regard, FIG. 32 illustrates "union-cell 1" which comes from the blank cell 1 of FIG. 25. FIG. 33 illustrates "union-cell 2" which comes from blank cell 2 of FIG. 26 body and tool cell 2 of FIG. 29. FIG. 34 illustrates the "union-cell 3" which comes from blank cell 3 of FIG. 27. FIG. 35 illustrates "union-cell 4" which comes from tool body cell 1 of FIG. 28. FIG. 36 illustrates "union-cell 5" which comes from tool body cell 3 of FIG. 30.

Figure 37:
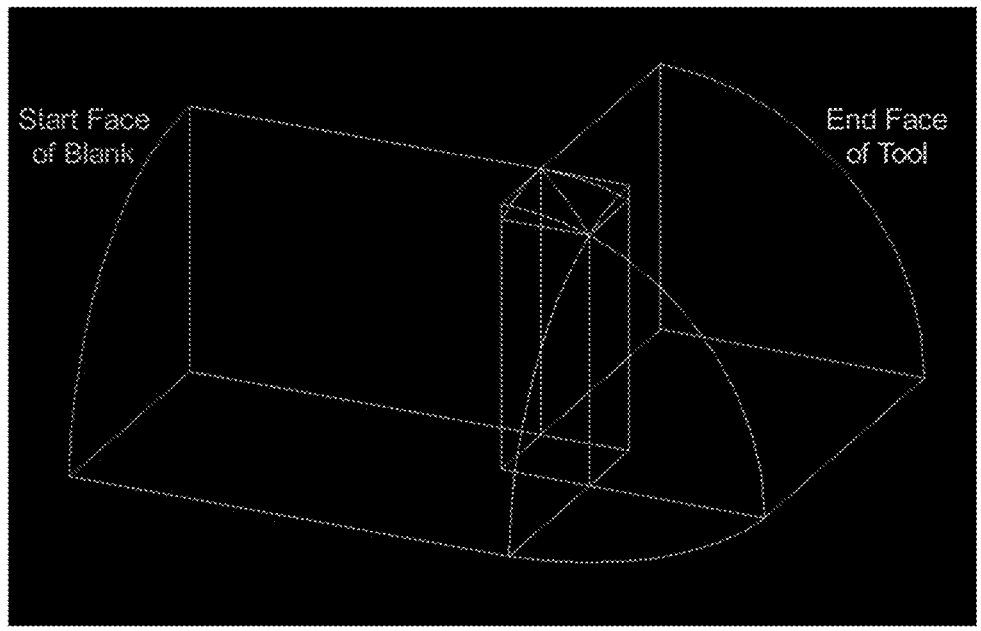
FIG. 37 illustrates the start face of the blank body and the end face of the tool body that are used during a selection process in accordance with one or more embodiments of the invention.
Figure 38:
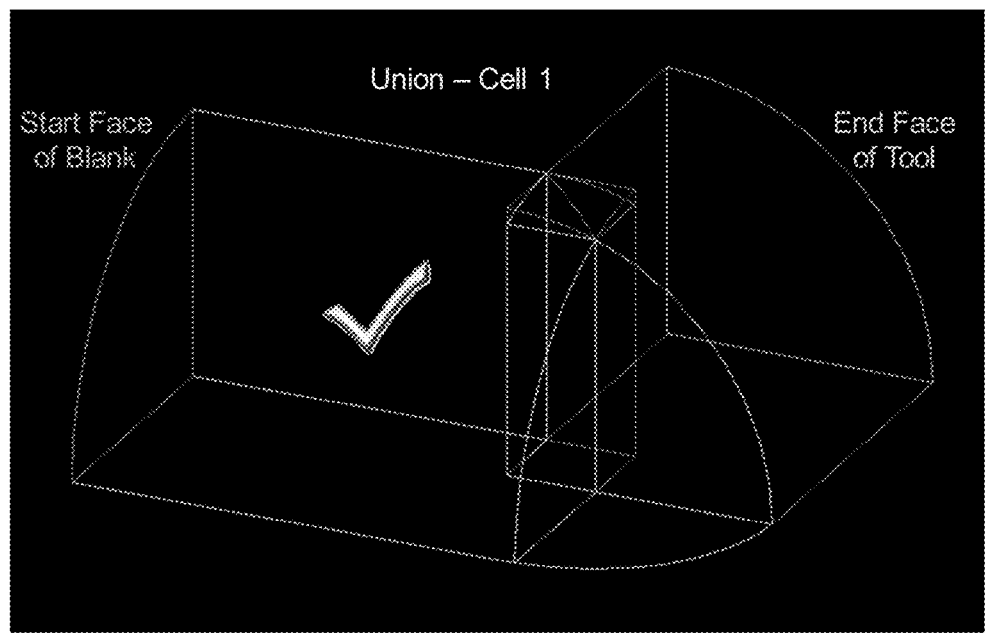
FIG. 38 illustrates the selection of "union-cell 1" as it contains the start face of the tool body in accordance with one or more embodiments of the invention.
Figure 39:
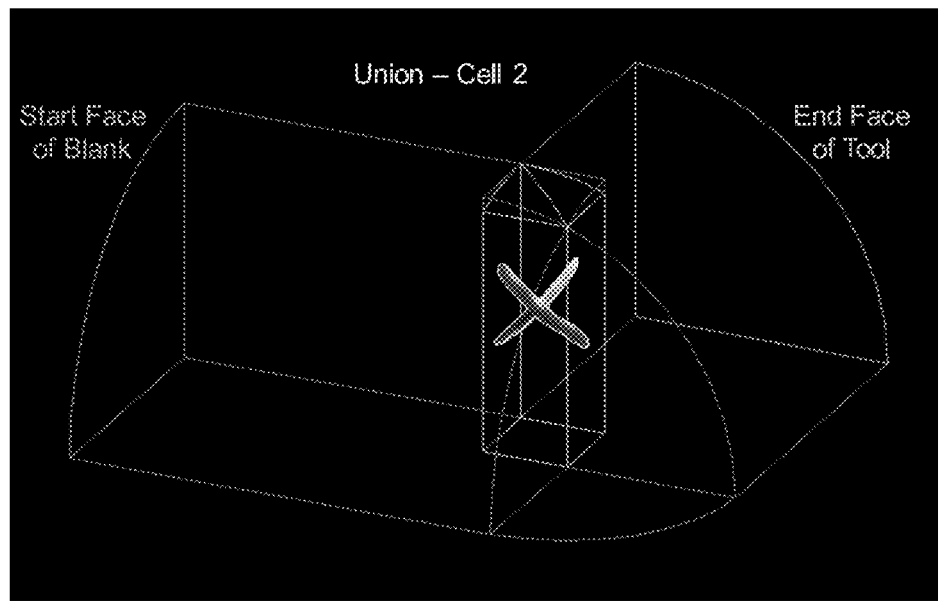
FIG. 39 illustrates that "union-cell 2" is not selected as it does not contain the start face or the end face in accordance with one or more embodiments of the invention.
Figure 40:
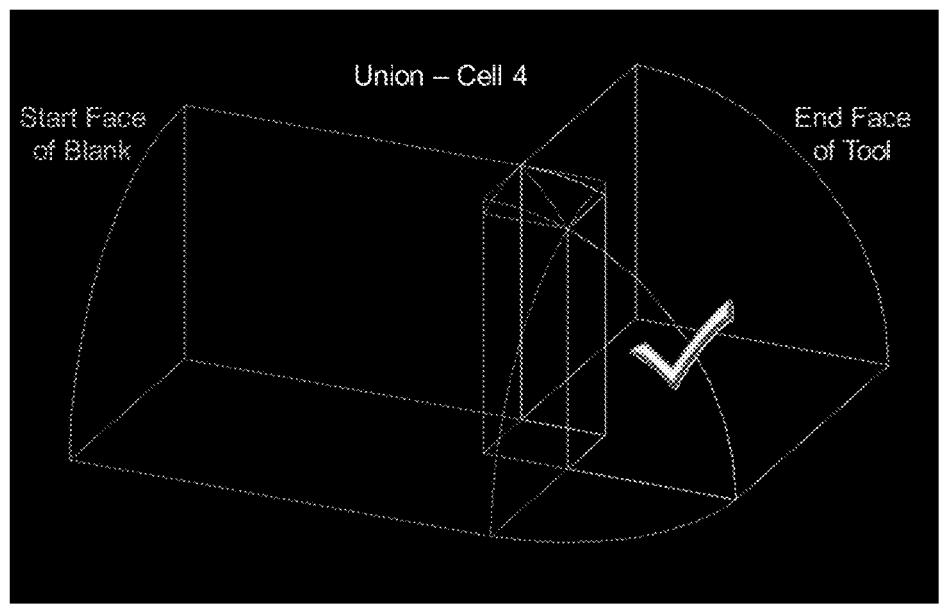
FIG. 40 illustrates the selection of union-cell 4 as it contains the end face of the tool body in accordance with one or more embodiments of the invention.

Once the non-regularized unions have been performed, particular cells need to be selected that will be used to produce the regularized body. At step 836, cells from the intersection graph are selected (illustrated as selected cells 838). Further, from the union graph, cells that contain the start faces of the blank body and the end faces of the tool body are selected. FIG. 37 illustrates the start face of the blank body and the end face of the tool body that are used during the selection process. In other words, if the "union-cell" contains either the start face of the blank body or the end face of the tool body, it is selected. Accordingly, FIG. 38 illustrates the selection of "union-cell 1" as it contains the start face of the blank body. FIG. 39 illustrates that "union-cell 2" is not selected as it does not contain the start face or the end face. Similarly, union-cell 3 and union-cell 5 are not selected. However, as illustrated in FIG. 40, union-cell 4 is selected as it contains the end face of the tool body.

Figure 41:
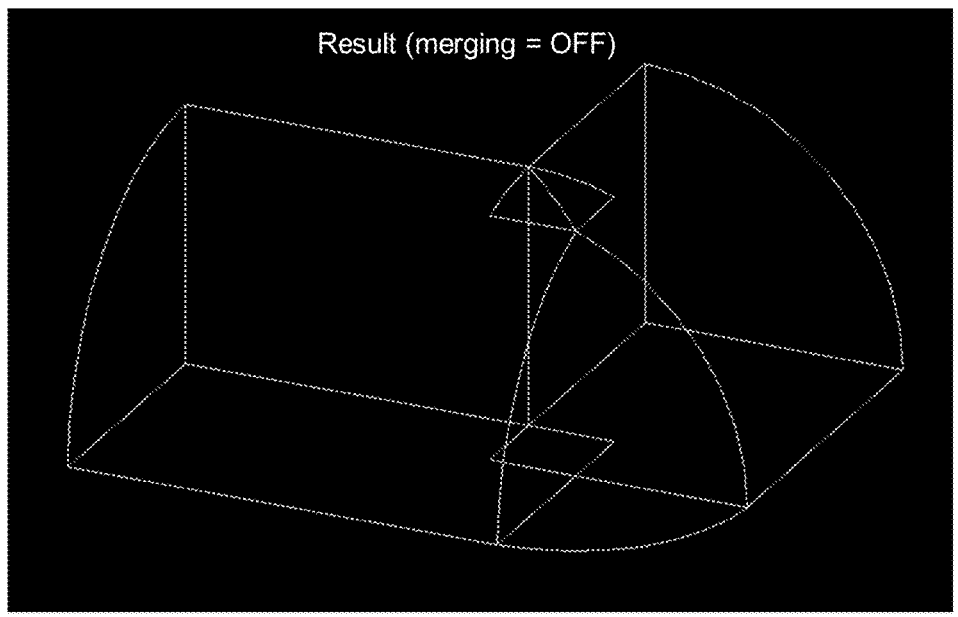
FIG. 41 illustrates the resulting regularized body with merging off in accordance with one or more embodiments of the invention.
Figure 42:
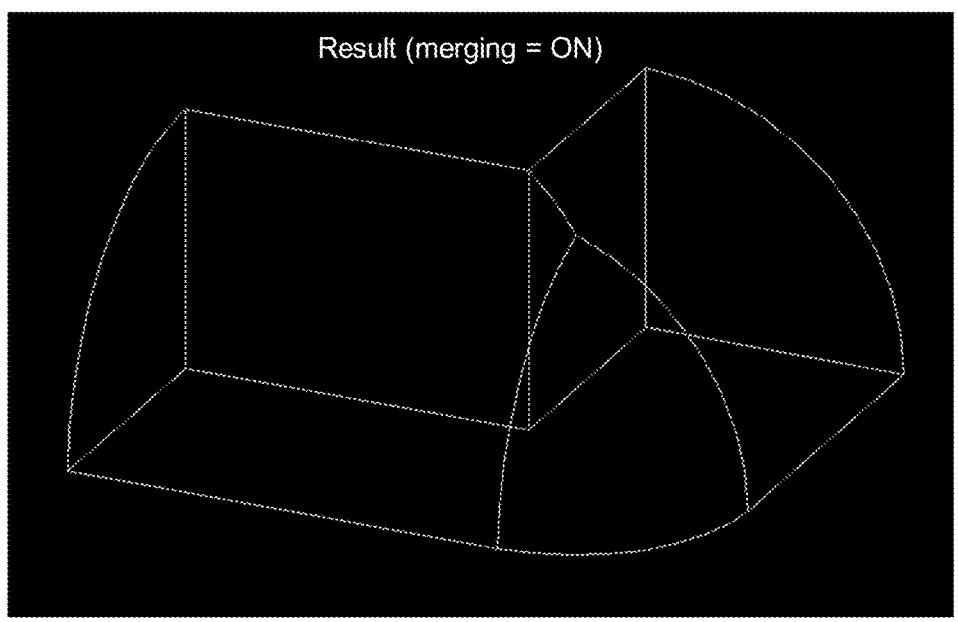
FIG. 42 illustrates the resulting regularized body with the cells merged in accordance with one or more embodiments of the invention.

At step 840, a regularized body is created that consists of the selected cells. FIG. 41 illustrates the resulting regularized body with merging off FIG. 42 illustrates the resulting regularized body with the cells merged.

Figure 43:
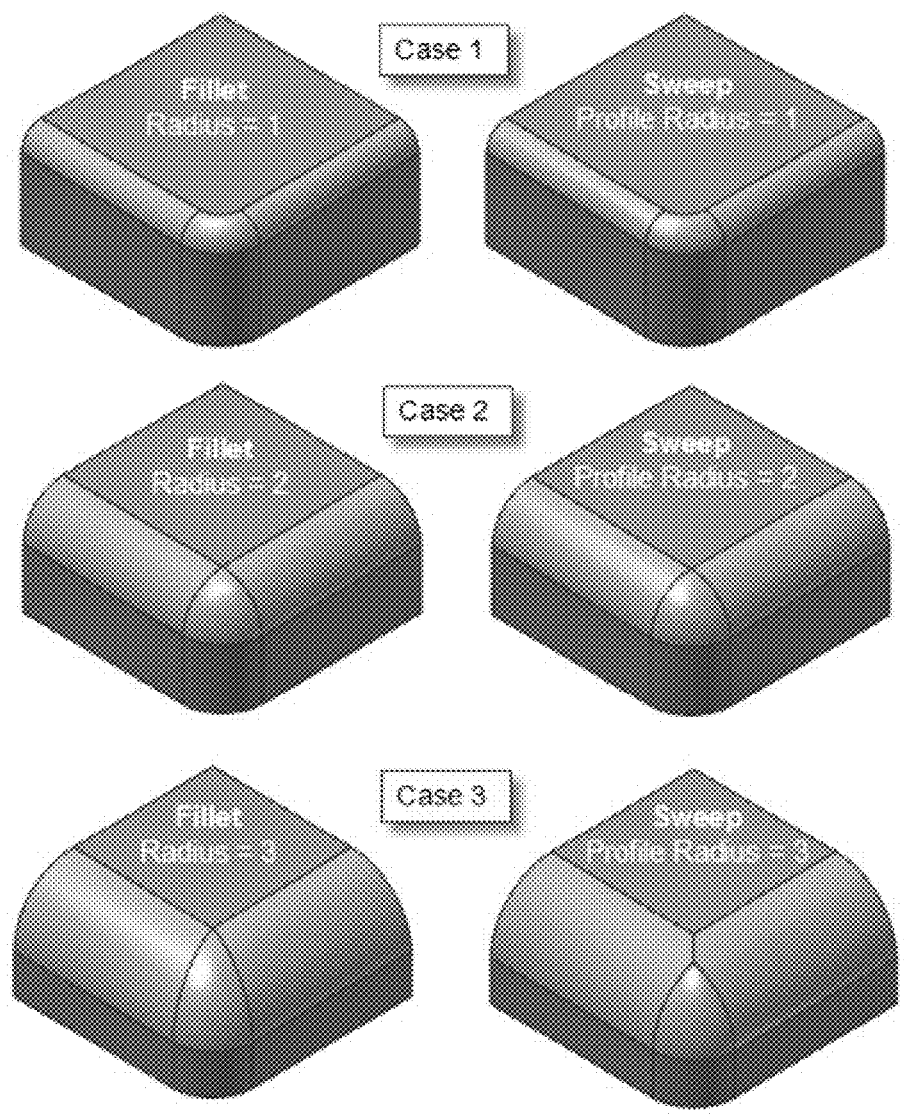
FIG. 43 illustrates exemplary resulting models where fillet and sweep operations were performed using different radii in accordance with one or more embodiments of the invention.

FIG. 43 illustrates exemplary resulting models where fillet and sweep operations were performed using different radii in accordance with one or more embodiments of the invention.

Figure 44:
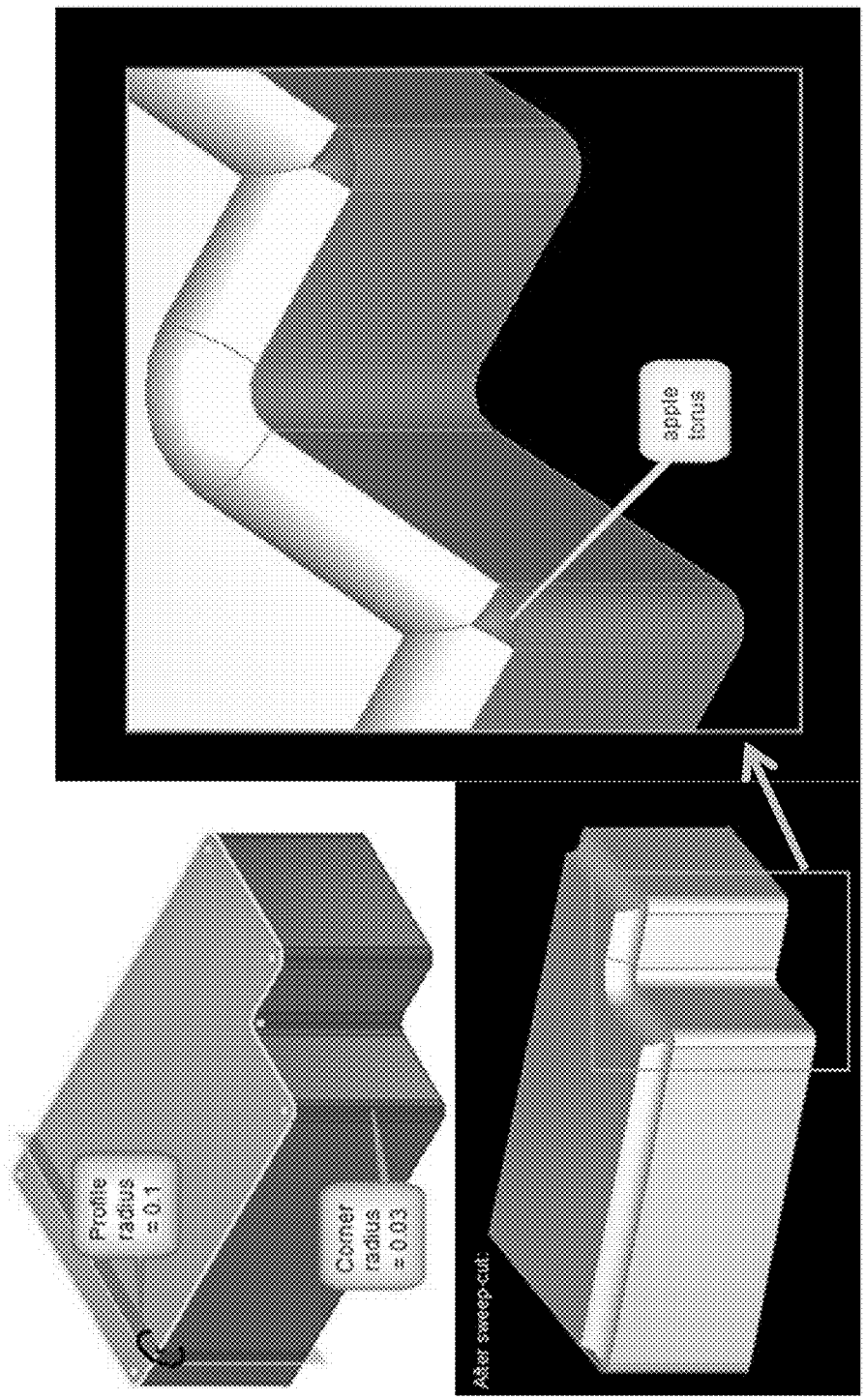
FIGS. 44-46 illustrate various real world examples that do not result in errors when performing a sweep/fillet operation in accordance with one or more embodiments of the invention.
Figure 45:
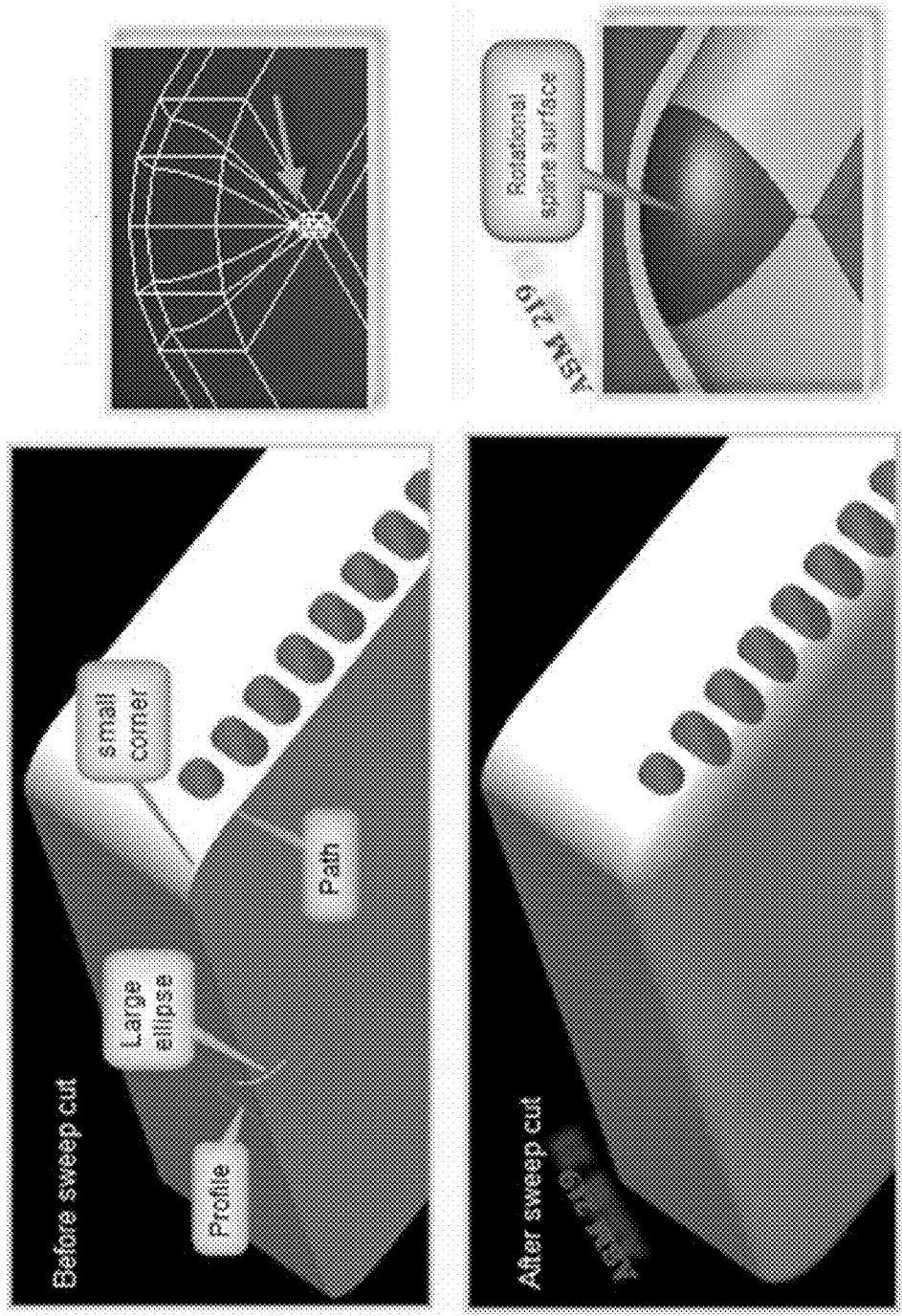
Figure 46:
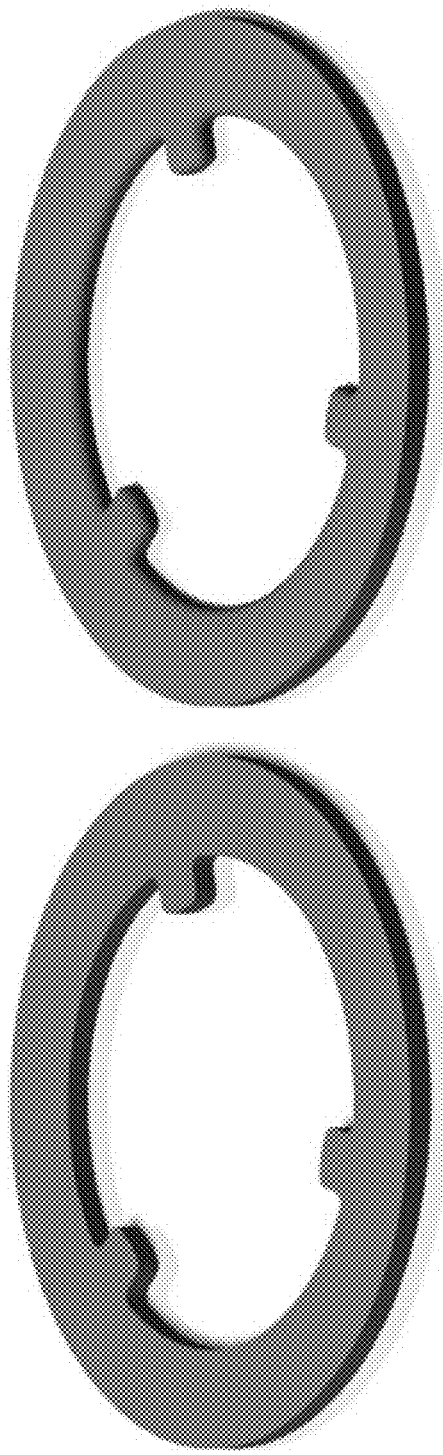
Figure 47:
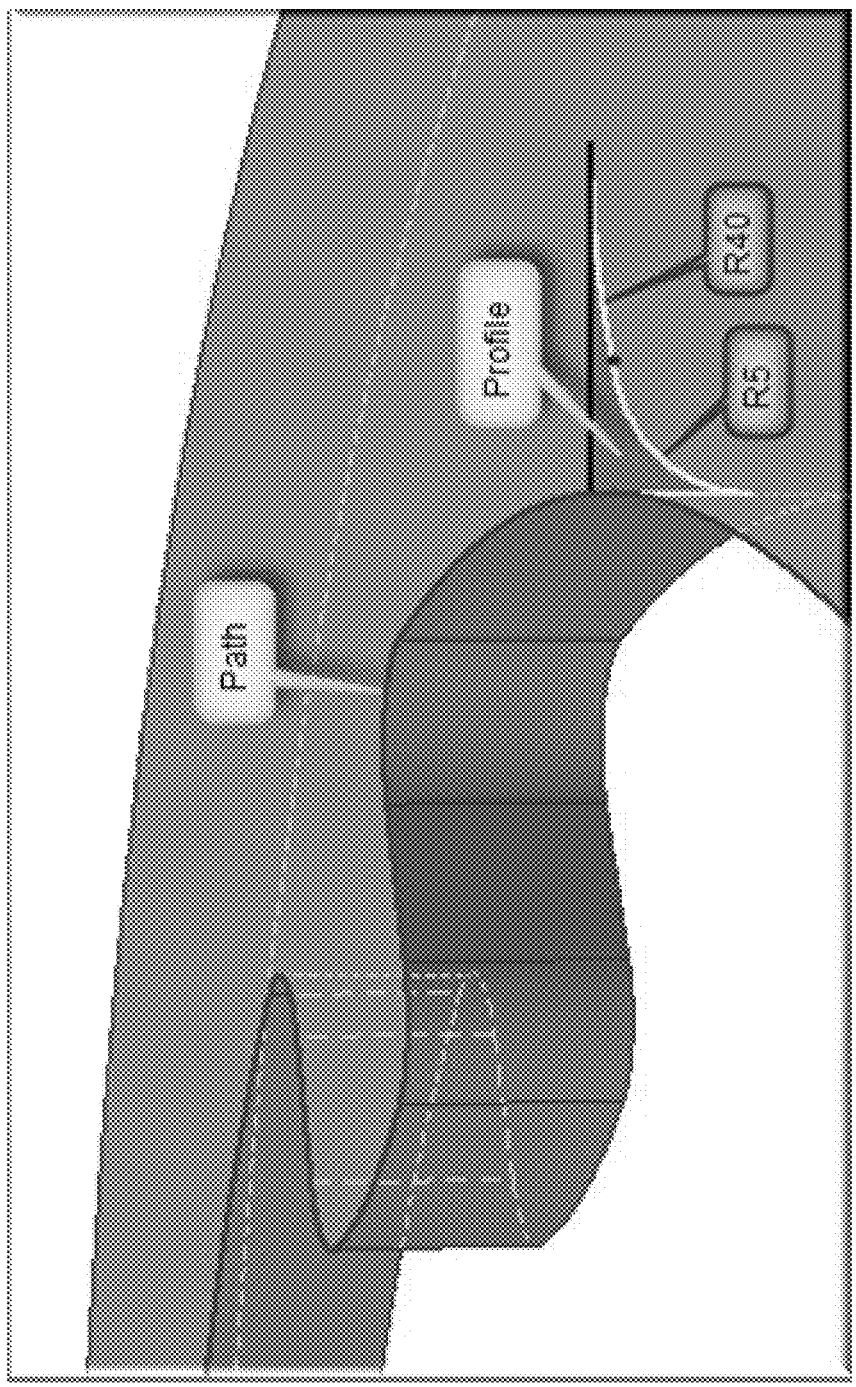
FIGS. 47-49 illustrate a more detailed view of FIG. 46 where a sweep-cut operation is performed in accordance with one or more embodiments of the invention.
Figure 48:
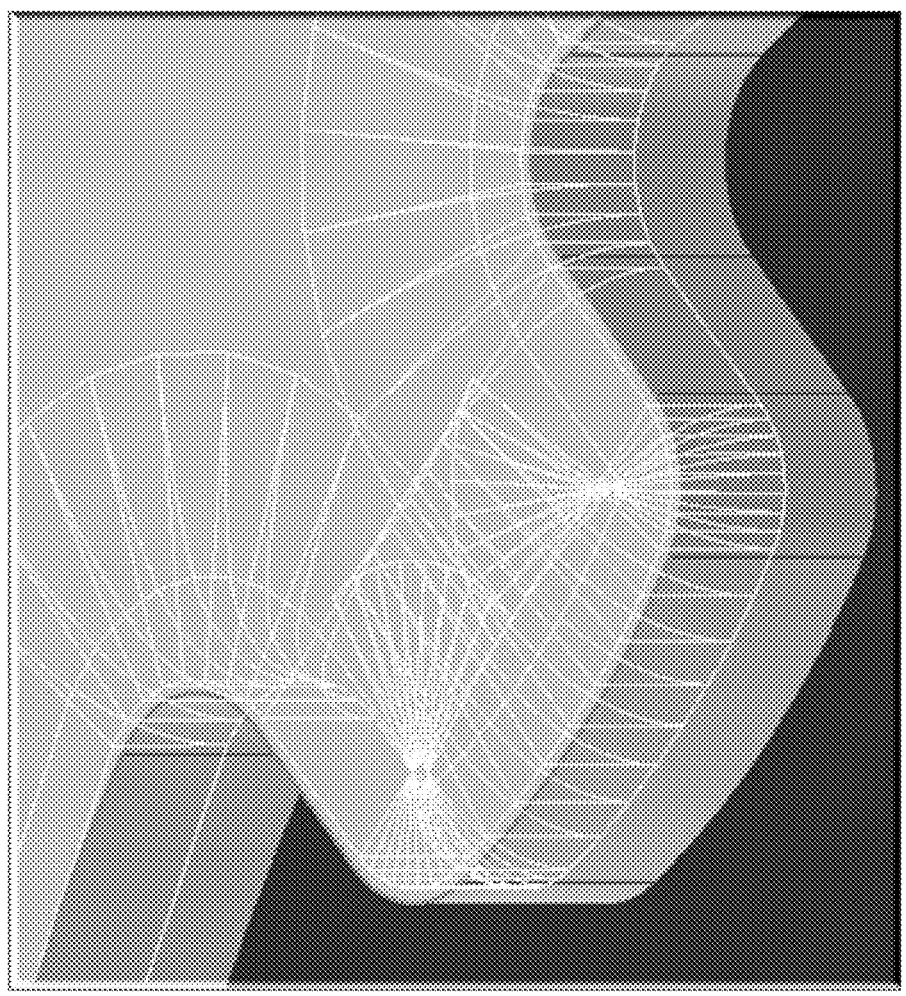
Figure 49:
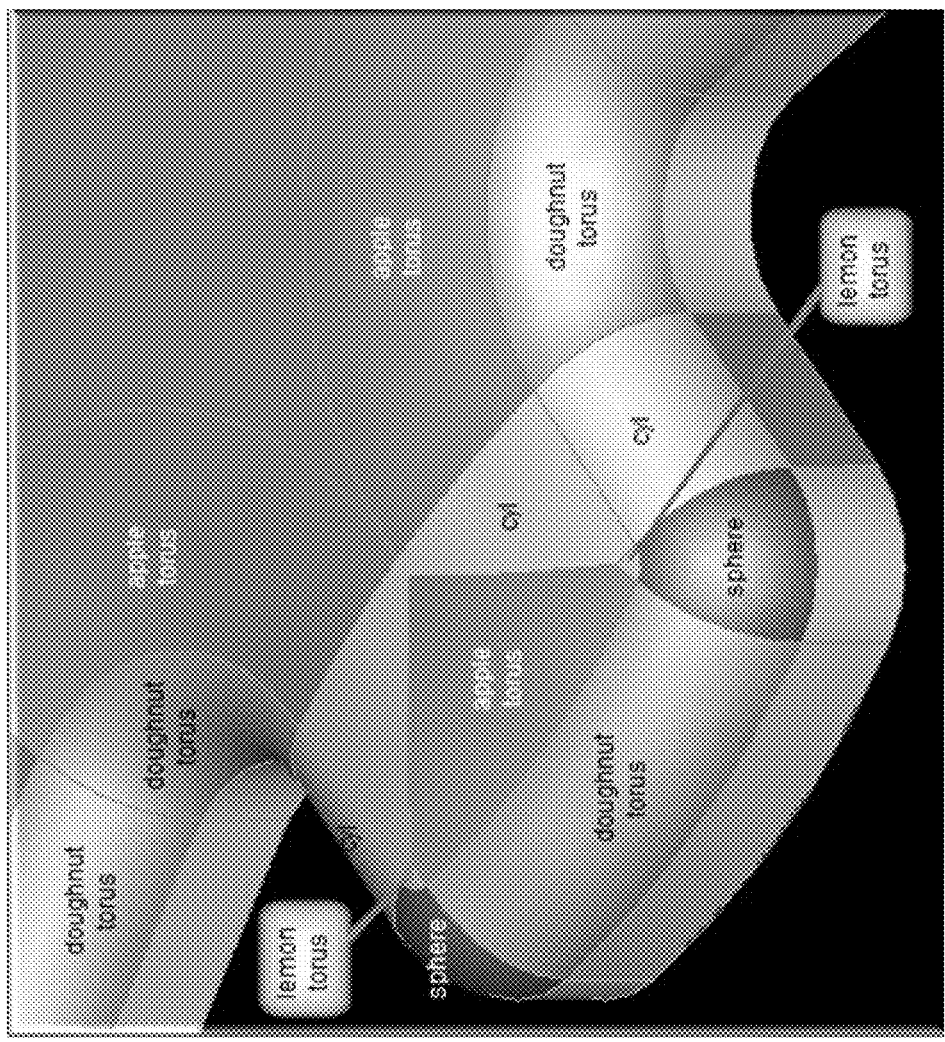

FIGS. 44-46 illustrate various real world examples that do not result in errors when performing a sweep/fillet operation in accordance with one or more embodiments of the invention. In particular, FIG. 45 illustrates the performance of a sweep-cut operation using a large ellipse as a profile along a path containing a small corner (resulting in a rotational spline surface). FIG. 46 illustrates a wafer clamp ring used for masks in semiconductor processing equipment both before and after a sweep-cut operation. FIGS. 47-49 illustrate a more detailed view of FIG. 46 where a sweep-cut operation is performed (with FIG. 49 illustrating the different resulting shapes formed based on the sweep-cut operation).

CONCLUSION

This concludes the description of the preferred embodiment of the invention. The following describes some alternative embodiments for accomplishing the present invention. For example, any type of computer, such as a mainframe, minicomputer, or personal computer, or computer configuration, such as a timesharing mainframe, local area network, or standalone personal computer, could be used with the present invention.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A computer-implemented method for sweeping a profile along a circular arc of a path, comprising:
   initializing, in a computer-aided design (CAD) application, a sweep operation to sweep a profile along an arc of a path, wherein the path comprises one or more path segments;
   for each path segment that is circular, determining, in the CAD application, whether the profile crosses an axis of revolution of the circular path segment at a start position of the circular path segment;
   trimming, in the CAD application, the profile that crosses the axis of revolution of the circular path segment;
   storing the trimmed profile and an association with the circular path segment having the axis of revolution that is crossed by the trimmed profile; and
   performing, in the CAD application, a selective union operation joining solid bodies from the trimmed profiles.

2. The computer-implemented method of claim 1, wherein the trimming comprises:
   determining the axis of revolution of the circular path segment, wherein the axis of revolution has a root at a center of a circle based on the circular path segment;
   dividing the profile into a first region and a second region using the axis of revolution;
   identifying a direction of the circular path segment using a right hand rule;
   determining a reference vector having a reference direction from the root to the start position;
   computing a first centroid of the first region and a second centroid of the second region;
   computing a first centroid vector that projects to the first centroid and a second centroid vector that projects to the second centroid;
   determining whether to keep the first region and discard the second region, or to keep the second region and discard the first region based on the first centroid vector and the second centroid vector; and
   trimming the first region or the second region based on the determining of whether to keep the first region or the second region.

3. The computer-implemented method of claim 2, wherein the computing the first centroid vector and the second centroid vector comprises:
   computing a first root centroid vector that projects from the root to first centroid and a second root centroid vector that projects from the root to the second centroid;

computing a first perpendicular vector that projects to the first centroid that is perpendicular to the axis of revolution; and computing a second perpendicular vector that projects to the second centroid that is perpendicular to the axis of revolution.

4. The computer-implemented method of claim 2, wherein the determining whether to keep the first region and discard the second region, or to keep the second region and discard the first region, comprises:

determining whether the first perpendicular vector or the second perpendicular vector points in a same direction as the reference vector; and maintaining the first region if the first perpendicular vector points in the same direction as the reference vector and discarding the second region, and maintaining the second region if the second perpendicular vector points in the same direction as the reference vector and discarding the first region.

5. The computer-implemented method of claim 1, wherein the performing the union operation comprises:

as the profile is swept along the path, a blank body from a previous path segment is united with a tool body for a current path segment.

6. The computer-implemented method of claim 5, further comprising:

determining if a trimmed profile is used for the previous path segment;

performing a regular union operation if the trimmed profile was not used for the previous path segment; and if a trimmed profile is used for the previous path segment, performing a selective union operation.

7. The computer-implemented method of claim 6, wherein the performing the selective union operation comprises:

performing a non-regularized union of the blank body and the tool body, and attaching a cellular topology to a resulting union, wherein the resulting union comprises an intersection graph and a union graph;

selecting one or more intersection graph cells from the intersection graph;

selecting one or more union graph cells from the union graph, wherein the selected one or more union graph cells comprise a start face of the blank body and an end face of the tool body; and creating a regularized body comprising the selected one or more intersection graph cells and the selected one or more union graph cells.

8. An apparatus for sweeping a profile along a circular arc of a path in computer system comprising:

(a) a computer having a memory; and
(b) a computer-aided design (CAD) application executing on the computer, wherein the CAD application is configured to:
  (i) initialize a sweep operation to sweep a profile along an arc of a path, wherein the path comprises one or more path segments;
  (ii) for each path segment that is circular, determine whether the profile crosses an axis of revolution of the circular path segment at a start position of the circular path segment;
  (iii) trim the profile that crosses the axis of revolution of the circular path segment;
  (iv) store the trimmed profile and an association with the circular path segment having the axis of revolution that is crossed by the trimmed profile; and
  (v) perform a selective union operation joining solid bodies from the trimmed profiles.

9. The apparatus of claim 8, wherein the CAD application is configured to trip by:

determining the axis of revolution of the circular path segment, wherein the axis of revolution has a root at a center of a circle based on the circular path segment;

dividing the profile into a first region and a second region using the axis of revolution;

identifying a direction of the circular path segment using a right hand rule;

determining a reference vector having a reference direction from the root to the start position;

computing a first centroid of the first region and a second centroid of the second region;

computing a first centroid vector that projects to the first centroid and a second centroid vector that projects to the second centroid;

determining whether to keep the first region and discard the second region, or to keep the second region and discard the first region based on the first centroid vector and the second centroid vector; and trimming the first region or the second region based on the determining of whether to keep the first region or the second region.

10. The apparatus of claim 9, wherein the CAD application is configured to compute the first centroid vector and the second centroid vector by:

computing a first root centroid vector that projects from the root to first centroid and a second root centroid vector that projects from the root to the second centroid;

computing a first perpendicular vector that projects to the first centroid that is perpendicular to the axis of revolution; and computing a second perpendicular vector that projects to the second centroid that is perpendicular to the axis of revolution.

11. The apparatus of claim 9, wherein the CAD application is configured to determine whether to keep the first region and discard the second region, or to keep the second region and discard the first region, by:

determining whether the first perpendicular vector or the second perpendicular vector points in a same direction as the reference vector; and maintaining the first region if the first perpendicular vector points in the same direction as the reference vector and discarding the second region, and maintaining the second region if the second perpendicular vector points in the same direction as the reference vector and discarding the first region.

12. The apparatus of claim 8, wherein the CAD application is configured to perform the union operation by:

as the profile is swept along the path, a blank body from a previous path segment is united with a tool body for a current path segment.

13. The apparatus of claim 12, the CAD application is further configured:

determine if a trimmed profile is used for the previous path segment;

perform a regular union operation if the trimmed profile was not used for the previous path segment; and if a trimmed profile is used for the previous path segment, perform a selective union operation.

14. The apparatus of claim 13, wherein the CAD application is configured to perform the selective union operation by:

performing a non-regularized union of the blank body and the tool body, and attaching a cellular topology to a resulting union, wherein the resulting union comprises an intersection graph and a union graph;

selecting one or more intersection graph cells from the intersection graph;

selecting one or more union graph cells from the union graph, wherein the selected one or more union graph cells comprise a start face of the blank body and an end face of the tool body; and creating a regularized body comprising the selected one or more intersection graph cells and the selected one or more union graph cells.

* * * * *